(12) United States Patent
    Kunze et al.

(10) Patent No.: US 12,675,050 B2
(45) Date of Patent: Jul. 7, 2026

(54) APPARATUS AND METHOD FOR LASER INTERFERENCE STRUCTURING OF SUBSTRATES WITH PERIODIC DOT STRUCTURES FOR ANTI-REFLECTION PROPERTIES

(71) Applicant: FUSION BIONIC GMBH, Dresden (DE)

(72) Inventors: Tim Kunze, Dresden (DE); Sabri Alamri, Dresden (DE)

(73) Assignee: FUSION BIONIC GMBH, Dresden (DE)

( * ) Notice: Subject to any disclaimer, the term of this patent is extended or adjusted under 35 U.S.C. 154(b) by 182 days.

(21) Appl. No.: 18/575,925

(22) PCT Filed: Jul. 4, 2022

(86) PCT No.: PCT/EP2022/068490
    § 371 (c)(1),
    (2) Date: Jan. 2, 2024

(87) PCT Pub. No.: WO2023/280793
    PCT Pub. Date: Jan. 12, 2023

(65) Prior Publication Data
    US 2024/0337950 A1      Oct. 10, 2024

(30) Foreign Application Priority Data

Jul. 3, 2021    (DE) ..................... 10 2021 117 204.7
    Mar. 31, 2022   (LU) ......................................... 102920

(51) Int. Cl.
    *G03F 7/20*          (2006.01)
    *G02B 27/09*         (2006.01)

*G02B 27/10*          (2006.01)
*G03F 7/00*           (2006.01)

(52) U.S. Cl.
    CPC ..... *G03F 7/70408* (2013.01); *G02B 27/0927* (2013.01); *G02B 27/0955* (2013.01); *G02B 27/1093* (2013.01); *G03F 7/70025* (2013.01)

(58) Field of Classification Search
    CPC ............ G03F 7/70408; G03F 7/70025; G02B 27/0927; G02B 27/0955; G02B 27/1093; G02B 27/0905; G02B 27/0944
    See application file for complete search history.

(56) References Cited

U.S. PATENT DOCUMENTS

2004/0227927 A1*  11/2004  Battiato ............. G02B 6/02133
                                                          356/37
2013/0242398 A1*   9/2013  Taguchi ................. G02B 1/118
                                                          359/601
2020/0156187 A1*   5/2020  Ko ..................... G02B 27/1093

* cited by examiner

*Primary Examiner* — Mesfin T Asfaw
(74) *Attorney, Agent, or Firm* — Zhigang Ma

(57)          ABSTRACT

The present invention relates to the field of patterning substrates with periodic dot structures in the micro- or sub-micrometer range, in particular to an apparatus and a method for structuring surfaces and the interior of a transparent substrate by means of laser interference structuring. The pattern produced in this way with periodic dot structures in the micro- or sub-micrometer range is characterized by a pronounced anti-reflective property. In addition, the present invention relates to a patterned substrate with anti-reflective properties comprising a periodic dot structure.

21 Claims, 8 Drawing Sheets

Figure 1:
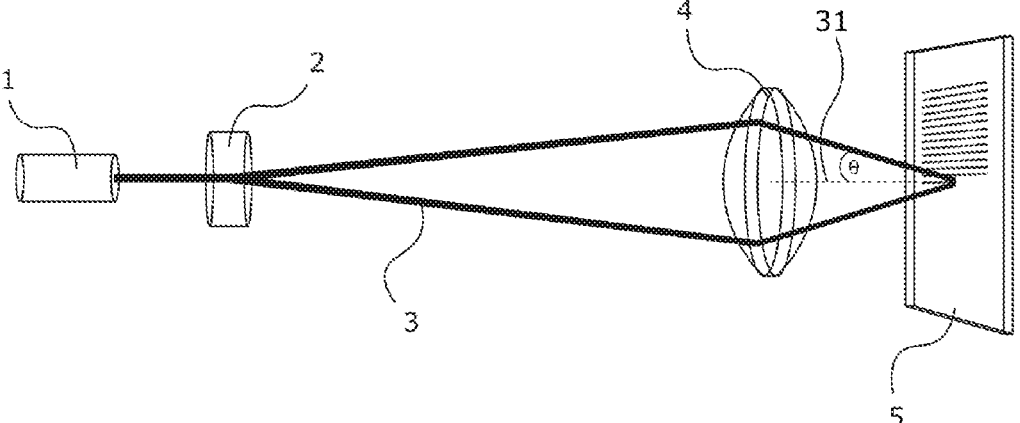

APPARATUS AND METHOD FOR LASER INTERFERENCE STRUCTURING OF SUBSTRATES WITH PERIODIC DOT STRUCTURES FOR ANTI-REFLECTION PROPERTIES

This application is a National Stage entry under § 371 of International Application No. PCT/EP2022/068490, filed on Jul. 4, 2022, and which claims the benefit of priority to German Patent Application No. DE 10 2021 117 204.7, filed on Jul. 3, 2021 and Luxembourg Patent Application No. LU102920, filed on Mar. 31, 2022. The content of each of these applications is hereby incorporated by reference in its entirety.

TECHNICAL FIELD

The present invention relates to the field of structuring substrates, in particular to an apparatus and a method for structuring surfaces and the interior of a transparent substrate by means of laser interference structuring. In addition, the present invention relates to a structured substrate—exemplified here are flat substrates, in particular so-called anti-reflective glazing—with anti-reflective properties, which comprises a periodic dot structure.

STATE OF THE ART

Methods for treating surfaces are known from the prior art with which the surface of transparent substrates, in particular glass, but also solid polymers, can be modified in such a way that the reflection of the substrate can be reduced. Typical processes apply an additional material to the surface of the substrate to be anti-reflective (so-called structure or layer-building processes), where the refractive index of the various materials differs.

In U.S. Pat. No. 8,557,877 B2, for example, a possible layer-building process is explained. In this process, first a coating solution is produced from at least two chemical starting materials, then the pH value of the coating solution is reduced and optionally diluted with a further solution before the coating solution is applied to the desired substrate. This type of coating process uses various chemical substances that often have a negative environmental impact and are expensive and time-consuming to dispose of and handle.

This type of process is based on a reduction in reflectance through destructive interference. Herein, the refractive index of the material used for the coating must be matched to the substrate to be coated and the medium surrounding the substrate (usually air). Since not every coating material can be processed in the same way, such a procedure necessitates the use of different processes for coating different substrate materials.

U.S. Pat. No. 10,459,125 B2 therefore describes a process in which a so-called moth-eye structure is chemically generated on a substrate by applying a polymer film to the substrate. This type of structure is modeled on the principle of the moth's eye, on the surface of which there are regularly arranged nanostructures whose dimensions are smaller than the wavelength of the light incident on them. This creates a layer with a graduated refractive index at the transition between the medium surrounding the substrate and the substrate itself, which significantly reduces reflection.

A film produced in this way can be used independently of the substrate to be coated, as the reduction in reflection does not depend on the refractive index of the material used for the coating. However, the coating method is still based on chemical substances with the disadvantages already mentioned above.

In addition, a coating produced in this-way is susceptible to mechanical stress (abrasion, impact, etc.) and ages accordingly quickly. After some time, the coating therefore often detaches from the substrate and/or loses its reflection-reducing properties.

WO 2019/166836 A1 describes a method for producing an anti-reflective structure in which the surface of a substrate is processed using a laser to give it anti-reflective properties. The substrate material is modified with a focused laser beam, thereby creating a nanostructure through self-assembly processes using laser-induced periodic surface structures (LIPSS). A quasi-periodic repetitive structure can be generated by the appropriate selection of laser fluence and superposition of the beam focal points on the substrate surface. This results in an anti-reflective surface. No chemicals are required and a wide range of substrate materials can be processed in this way.

However, this method works successively and is time-consuming due to the underlying self-assembly process of the LIPSS. It is not possible to create nanostructures over a large area in a single step, as the LIPSS are only formed by repeatedly processing nearby surface areas. In addition, the regularity of the structure depends on the specific process and environmental conditions, so that deviations in the surface condition (slightly different material, microscopic contamination) can lead to altered results.

EP 2 431 120 A1 discloses a method for direct structuring of a thin film, in which periodic structures can be produced in thin metal films by means of interfering laser beams. In this process, several pulsed laser beams are directed onto the thin film, whereby these interfere in an interference region so that the material of the thin film is vaporized in the areas of high intensity. The process is characterized by the fact that the resulting structure can be changed by adjusting the intensity of the laser beams or shifting the film in the z-direction (i.e. in the direction of the incident laser beams or away from them). Additional optical elements are used to create a phase shift between the laser beams, which influences the interference pattern. The incident laser beams are focused onto the surface of the thin film by a focusing element and thereby reduced in size, resulting in areas of high intensity in which the material of the thin film is vaporized.

This process requires a way of modifying the intensity of the incident laser beams. This can be done either by specifying a particular laser radiation source or by using a unit to control the intensity of the laser beam. The intensity must be set depending on the evaporation threshold of the thin film material. Hence, different laser radiation sources must be used for different materials, or an additional element for intensity control is required. Shifting the optical elements does not allow control of the resulting interference pattern. When processing materials with a high evaporation threshold, damage to the optical elements in the optical path of the laser beam is also conceivable.

In US 2004/0227927 A1, an apparatus for interferometry is disclosed which is designed to generate an interference pattern with variable periodicity in a focal point, wherein the apparatus comprises a movable beam splitter element and a movable reflector which split an incident laser beam into two laser sub-beams and deflect at least one of the laser sub-beams, wherein the periodicity can be varied by moving the beam splitter element and the reflector. The beam splitter element and the reflector are moved by a motorized platform.

This apparatus has a complex and wear-prone structure, as the beam shaping for influencing the periodicity of the generated interference pattern can only be realized by moving two optical elements, namely the beam splitter element and the reflector. In addition, the distance between the beam splitter element and the reflector is fixed and their arrangement on a motorized platform is space-consuming.

Methods for direct laser interference patterning are known from scientific publications ("Microfabrication and Surface Functionalization of Soda Lime Glass through Direct Laser Interference Patterning", Soldera et al., Nanomaterials 2021). However, these methods require a complex modification and realignment of more than one optical element in the optical path to control the generated structures. In industrial applications with a high throughput of substrates to be structured with varying requirements for the desired structure widths, this requires regular movement and adjustment of the optical elements in the optical path, which makes the process less flexible and exposes the optical elements to greater wear and risk of damage with each utilization as a result of the respective new adjustment of the optical elements.

Furthermore, the minimum structure dimensions that can be produced by direct laser interference structuring are limited to the micrometer range. The minimum dimensions that can be generated, as found in the publications, are in a range that is in some cases significantly greater than the wavelength of radiation in the visible spectrum. An anti-reflection structure produced in this way may exhibit undesirable diffraction patterns for light of particularly short-wavelength and is not suitable for preventing reflection in these wavelength ranges or for ensuring the transmission of incident light rays from the complete spectrum of visible light.

Another publication ("Improving throughput and microstructure uniformity in Direct Laser Interference Patterning utilizing top-hat shaped beams", El-Khoury et al., Research Square 2021) discloses the use of laser beams with Gaussian and top-hat profiles in an optical setup for generating an interference pattern on a substrate, wherein the optical setup comprises a laser beam source, a first deflecting element, a beam shaping element, a beam splitter element, a further deflecting element, and a focusing element. The periodicity of the interference pattern can be adjusted by moving the optical elements in relation to each other, in particular by moving the further deflecting element in the optical path of the laser (sub-) beams.

Herein, a large number of optical elements are required to generate the interference pattern, necessitating a complex and wear-prone setup. Furthermore, the structure period that can be generated are limited to a minimum of 6.7 µm.

Furthermore, a method for creating hierarchical micro-textures using laser-patterned stamps is known ("Hierarchical Microtextures Embossed on PET from Laser-Patterned Stamps", Bouchard et al., Materials 2021), wherein the laser-patterned stamp is created using Direct Laser Writing (DLW) and Direct Laser Interference Patterning (DLIP). A fixed optical setup was used, which generates a predetermined structure width of 3.1 µm for the interference patterning. The interference patterning generated in this way, with dimensions in the low micrometer range, is superimposed on a laser patterning generated by direct laser writing. Herein, a laser beam is directed directly onto the material in order to create a structure on the substrate, in particular a cone-shaped structure, in the area of maximum intensity. Herein, the diameter of the structure is typically around 110 µm, which is a multiple of the structure periods generated by interference structuring. The structure created in the substrate by superimposing the two structures is referred to as a hierarchical structure.

However, the given method is not suitable for producing an anti-reflective coating on an extensive substrate, as the structuring process consists of several process steps (successive structuring first using DLW, then DLIP), and the minimum structure dimensions that can be produced using the same setup are limited to the specified dimensions (3.1 µm). Thus, the apparatus shown and the method described are not suitable for producing a uniform anti-reflection structure within one structuring step and with variable structure widths which have anti-reflective properties for electromagnetic waves in the entire spectrum of visible light.

US 2001/035991 A1 discloses an interference lithography system with which an incident laser beam can be divided into more than two sections ("sub-beams") and with which a three-dimensional surface structure can be produced in a thin photoresist layer, whereby this surface structure can be formed as cylindrical or cup-shaped holes. However, the patent specification does not disclose that such structured substrates have anti-reflective properties or how such structures must be designed in order to generate anti-reflective properties.

EP 2 596 899 B1 discloses an apparatus and a method for interference structuring of extensive samples. The apparatus comprises a focusing arrangement which focuses a laser beam into the sample volume. The laser beam can also be focused in a further spatial direction which is not parallel to the first spatial direction. The apparatus contains an expanding and separating arrangement, which is positioned in the optical path after the focusing arrangement and which expands the laser beam. Only one such beam splitter, which is only suitable for splitting a laser beam into two partial beams, is part of the expanding and splitting arrangement.

OBJECT/AIM OF THE INVENTION

It is therefore the object of the present invention to provide an apparatus and a method with which a direct patterning of surfaces, e.g. transparent and/or extensive surfaces, can be produced without the use of environmentally harmful chemicals, which gives the material anti-reflective properties.

In addition, it is the object of the present invention to produce a patterning which is as robust as possible and which does not lose its effectiveness through usage of the transparent substrate. In addition, it should be possible to structure extensive samples within a short time.

A further object of the invention is to provide a method for patterning by means of laser interference which is independent of the intensity of the laser radiation source. The method should be configured so that the optical elements are not damaged even at high intensities on the substrate to be patterned.

Solution

The present invention provides an apparatus which enables the patterning of substrates, e.g. extensive and/or transparent substrates, by means of laser interference patterning. By means of this Apparatus, periodic dot structures with dimensions in the micro- and submicrometer range can be generated on the surface or inside transparent substrates, which give the substrate anti-reflective properties (increased transmission).

The present objectives are reached in accordance with the invention by means of a laser interference patterning apparatus for direct laser interference patterning of a substrate—by way of example, extensive and/or transparent substrates are to be mentioned herein—in accordance with claim 13, comprising a laser radiation source (1) for emitting a laser beam, a beam splitter element (2) arranged in the optical path (3) of the laser beam, a focusing element (4) which is arranged in succession of the beam splitter element in the optical path of the laser and configured so that the sub-beams pass through it in such a way that the sub-beams are interfereable on the surface or in the volume of a substrate (5), preferably extensive and/or transparent substrate, in an interference region, wherein the beam splitter (2) is freely movable along its optical axis in the optical path (3), and wherein the beam splitter (2) is arranged to split the incident laser beam emitted by the laser radiation source (1) into at least 2, preferably at least 3 sub-beams, more preferably at least 4, in particular 4 to 8, i.e. 4, 5, 6, 7 or 8 sub-beams.

Particularly preferably, the beam splitter (2) is set up in such a way that it splits the incident laser beam into an even multiple, i.e. 2, 4, 6 or 8 sub-beams, most preferably 4 sub-beams.

Alternatively or in addition to this, a beam splitter (2) can be provided in such a way that it comprises a first beam splitter and at least one further beam splitter arranged in succession of the first beam splitter, wherein the first beam splitter splits the incident laser beam into at least 2 sub-beams and the further beam splitter is arranged in at least one optical path of a sub-beam and splits this sub-beam into at least 2 sub-beams as it passes through.

For laser interference patterning of the substrate (5), preferably an extensive and/or transparent substrate, the laser beam emitted by the laser radiation source is split by the beam splitter element (2) into at least 3, preferably at least 4 sub-beams. Only double-beam interference (i.e. patterning by means of interference of two sub-beams) is known from the prior art. However, such two-beam interference only produces line patterns on the substrate.

The sub-beams are then deflected by the focusing element (4) so that they interfere on the surface or inside a substrate (5), preferably an extensive and/or transparent substrate, in an interference region, also known as an interference pixel.

This allows a two-dimensional, periodic dot structure with dimensions in the micro- and sub-micrometer range to be generated, the structure period of which can be freely adjusted by moving the beam splitter element (2) along its optical axis. Extensive processing of a substrate (5), preferably an extensive and/or transparent substrate, is possible.

Further advantageous embodiments can be found in the description and the subclaims.

General Advantages

One advantage of the apparatus defined herein is that this apparatus and the method that can be realized with its help can dispense with the use of chemicals and their costly disposal when patterning substrates, in particular when creating a structure with anti-reflective properties. In addition, the purification of the substrates can also be dispensed with.

Furthermore, a wide range of substrates, preferably extensive and/or transparent substrates, in particular transparent materials, can be processed with the apparatus. Since the process is not dependent on the refractive index or the adhesion of certain coating materials to the substrate, this process is therefore more flexible than conventional chemical processes.

Compared to WO 2019/166836 A1, the processing time according to this method is significantly lower, since the periodicity of the structures is ensured by the interference of the incident, at least 3, preferably at least 4 sub-beams in an interference region, and is not the result of more time-consuming self-assembly processes. Another advantage over conventional methods is that the shape (structural design; geometry) of the generated micro/nanostructures can be controlled. The geometry of the structures can be controlled by the number of interfering (sub-) beams, their polarization and by setting the process parameters, thereby influencing the anti-reflective properties in a targeted manner.

If the patterning is carried out in the volume, i.e. in the interior of the substrate, preferably extensive and/or transparent substrate, in particular in the transparent material, the resulting structure (i.e. the periodic dot structure of the patterned substrate) is less sensitive to impact and abrasion than conventional coatings. The inventors have discovered that the structure (also referred to herein as texture) inside the material (i.e. below the surface) does not necessarily produce anti-reflective properties. However, the texture inside the material is interesting for other applications such as product protection, optical data storage, decoration, etc.

It is of particular advantage that the setup of the apparatus disclosed herein or the arrangement of the optical component allows substrates to be patterned at very high patterning rates of up to 0.9 m²/min, in particular in the range from 0.01 to 0.9 m²/min, preferably in the range from 0.05 to 0.9 m²/min, most preferably in the range from 0.1 to 0.9 m²/min. This is ensured by the fact that the region in which the at least three sub-beams are superimposed can be widened by a preferred selection of optical elements, whereby a large area can be irradiated in one processing step. In contrast to the method known to the skilled person, such as direct laser writing, no strong focusing is required to generate high-resolution features.

Such a setup advantageously allows a surface of a substrate to be scanned quickly, so that a high patterning rate of up to 3 m²/min, in particular in the range of 0.05 to 2 m²/min, preferably in the range of 0.1 to 1 m²/min, most preferably in the range of 0.1 to 0.9 m²/min can be achieved. The exact patterning rate depends in particular on the available laser power. With future technologies that have a higher laser power, even higher patterning rates can therefore be achieved.

DETAILED DESCRIPTION

The apparatus according to the invention describes a structure for laser interference patterning of substrates, for example extensive and/or transparent substrates for producing a patterned substrate, comprising a periodic dot structure in the micro- or sub-micrometer range, in particular for producing a so-called anti-reflective glazing on the substrate or in the volume (i.e. inside) of this substrate.

Substrate

For the purposes of the invention, the term substrate refers to a substrate whose surface has an extension in several spatial directions. A substrate, preferably an extensive and/or transparent substrate, may be a planar substrate or a curved substrate, for example a parabolic substrate. For the purposes of the invention, extensive also means that the extent of a substrate, preferably a extensive and/or transparent substrate, for example a planar substrate in the x and y directions, or the extent of a curved substrate along its radius of curvature is greater than the extent of the region in which the at least three sub-beams interfere with each other.

In a preferred embodiment, the substrate is a substrate whose expansion in the x and y directions or whose expansion along a radius of curvature is less than or equal to the expansion of the region in which the at least three sub-beams interfere with each other. Homogeneous patterning of the substrate is possible in one processing step (during a laser pulse).

In a particularly preferred embodiment, the substrate is an extensive substrate whose extent in the x and y directions or whose extent along a radius of curvature is greater than the extent of the region in which the at least three sub-beams interfere with each other. By moving the substrate in the x and y plane, extensive, homogeneous structuring of the substrate is possible in several processing steps (with several laser pulses). The substrate can be moved by rotation or translation or by a superposition of rotation and translation.

For the purposes of the invention, the term substrate refers to a solid material with a reflective surface. Examples of such materials are metals, polymers, ceramics and glasses.

With regard to the substrates which can be processed by applying the laser interference patterning method according to the invention with a periodic dot structure defined herein, in particular with anti-reflective properties, there is a wide choice of transparent and translucent but also non-transparent materials within the scope of the present invention.

In a particularly preferred embodiment, the extensive substrate comprises a transparent material.

In general, the transparent material has a high transmittance of visible light, although this varies depending on the application. The transmittance of the transparent material is not less than 70%, preferably not less than 80%, more preferably not less than 90%, without deviation in the spectrum in the visible light range (wavelength 380 nm to 780 nm).

The geometry of the substrate can be variable; hence, extensive substrates that are, for example, planar, have curvatures or surface irregularities and/or non-extensive substrates, such as tubes or fibers, can be used.

Preferably, the substrate is an extensive and/or transparent material.

The substrate can be designed as a flexible and/or bendable substrate, such as a flexible glass film, an (artificial) leather, a metal foil, a thin sheet or a plastic film, such as is used, for example, in a solar film or in displays.

In a particularly preferred embodiment, the extensive substrate comprises a transparent material, preferably the substrate consists of a transparent material. A material or substrate is transparent in the sense of the present invention if it has a high transmittance for at least a sub-range of the spectrum of electromagnetic radiation between 1 nm and 1 m. Such partial ranges are, for example, electromagnetic radiation in the range of visible light from 380 nm to 780 nm or in a range which also includes infrared light, from 780 nm to 5,000 nm or in a range of infrared light (heat radiation) or in a range of microwave radiation, in particular radar radiation in the wavelength range from 1 mm to 10 m, or also another partial range which is adapted according to the desired application, in particular to the wavelength of the laser source. Such a sub-range preferably has a width of at least 10% or 50% of the wavelength, which forms the lower limit of the sub-range. For the purposes of the invention, a high transmittance in a partial range is a transmittance of at least 50% or preferably at least 70% or particularly preferably at least 80% or at least 90% for each wavelength in the partial range, i.e. for the entire spectrum in the partial range. However, a transparent substrate can also be described as a substrate which selectively has a high transmittance for certain wavelength ranges in the visible light range, e.g. the substrate has a high transmittance for electromagnetic radiation with wavelengths in the range from 500 nm to 800 nm. The transmittance can vary over the wavelength range that is transmitted, e.g. not less than 70% for wavelengths in the range from 380 nm to 500 nm and not less than 90% in the range from 500 nm to 750 nm. For example, the substrate transmits radiation with wavelengths from 380 nm to 780 nm. It has particularly high transmission, e.g. a transmittance of 90%, at wavelengths from 450 nm to 690 nm; the transmittance at wavelengths below and above this is, for example, 70%.

The translucency of a transparent material also offers the advantage that laser interference processing of a plane in the volume/inside of the substrate is possible.

For the purposes of the present invention, a transparent material includes transparent materials, in particular glass (e.g. borosilicate glasses, quartz glasses, alkaline-earth-alkali-silicate glasses (e.g. soda-lime glass), aluminosilicate glasses, metallic glasses), but also solid polymers (e.g. polycarbonates, such as Makrolon® and Apec®; polycarbonate blends, such as Makroblend® and Bayblen®; polymethyl methacrylate, such as Plexiglas®; polyester; polyethylene terephthalate, polypropylene, polyethylene) as well as transparent ceramics (e.g. spinel ceramics, such as Mg—Al spinel, ALON, aluminum oxide, yttrium aluminum garnet, yttrium oxide or zirconium oxide) or mixtures thereof. Polycarbonates are homopolycarbonates, copolycarbonates and thermoplastic polyester carbonates.

According to a particularly preferred embodiment, the transparent material comprises a glass (as defined herein) or a solid polymer (as defined herein).

The silicate framework of glass preferably provides a transmission window for wavelengths in the range between 170 nm and 5,000 nm, i.e. wavelength range that includes visible light in the range of 380 nm to 780 nm and includes infrared radiation.

Alternatively, the substrate, preferably an extensive and/or transparent substrate, can also comprise an opaque material. By patterning the non-transparent material, a periodic dot structure in the micro- or sub-micrometer range, as defined herein, is created on the surface of the non-transparent material. As a result, a structure with anti-reflective properties can be generated on an opaque material, whereby the original roughness of the surface of the opaque substrate (i.e. before application of the patterning according to the invention) remains unchanged or almost unchanged in the macroscopic range, effectively inducing a reflection reduction of an otherwise reflective surface of an opaque material, e.g. a metal surface. Suitable non-transparent materials include metals (e.g. silicon, aluminum, copper, gold), metallic alloys (e.g. steel, brass), ceramic materials (e.g. zirconium oxide, titanium dioxide, zirconium dioxide) and polymers (PEEK, polyether ether ketones; polyfluorinated hydrocarbons such as Teflon) as well as combinations thereof. For example, such a patterned substrate is suitable as a negative mold for the indirect application or generation of structures on another substrate. The patterned substrate can, for example, be used as a "stamp" to create a structure inverse to the structure created on the substrate on any number of other substrates. In addition, such a patterned substrate exhibits increased diffraction of electromagnetic radiation, whereby the patterning of the substrate results in a reduction in the directional reflection of the substrate. Due to the structure dimensions, scattering processes occur on these structures, which are introduced by the interference patterning at the level of the substrate, in particular on one of its surfaces.

Dot Structure/Interference Pattern/Anti-reflective Glazing

The present invention also comprises a patterned substrate (5) with anti-reflective properties, wherein the patterned substrate comprises a periodic dot structure in the micro- or sub-micrometer range, wherein the periodic dot structure is formed from inverse cones, and wherein the inverse cones are periodically spaced with a distance relative to their respective saddle point or center of height (circular base) in the range from 50 nm to 50 µm, preferably in the range from 50 nm to 20 µm, more preferably in the range from 100 nm to 4 µm, more preferably in the range from 100 nm to 4 µm.

For the purpose of the present invention, the term inverse cones refers to structures with a circular, elliptical, triangular or substantially rectangular base, in particular with a circular base, which converge in a conical shape in the vertical direction into the substrate and have a rounded cone tip at their saddle point. The inverse cones are formed during the patterning process, i.e. when a laser pulse hits the substrate to be structured as a result of a high-intensity region hitting the substrate, whereby the regions between the inverse cones on or within the substrate ideally remain essentially unstructured due to destructive interference whose intensity is zero. Consequently, by focusing the laser (sub-) beams on or within the substrate, the negative of what the intensity distribution specifies is formed. The described shape of the inverse cones refers to dot structures that are arranged on the surface of the substrate. An arrangement of the point structures in or along a plane within the volume results in a shape which is symmetrical. For the purposes of the invention, the dot structures generated within a volume by means of laser interference structuring are also referred to as inverse cones.

Cones with an elliptical base can be generated, for example, by tilting the substrate in relation to the angle of incidence of the focused laser (sub-)beam(s), by tilting the interference volume (i.e. volumetric pixel, voxel; the angle at which the sub-beams are focused on the surface or in the volume of the substrate so that they interfere in an interference region) to the substrate, for example by tilting the apparatus to the substrate, or by a combination thereof. According to a preferred embodiment, cones with an elliptical base are generated by tilting the substrate in relation to the angle of incidence of the focused laser (sub-)beams.

The period of the structure is referred to as A for the purposes of the invention. It is generally dependent on the wavelength of the interfering laser (sub-) beams, the angle of incidence of the interfering laser (sub-) beams and the number of interfering laser (sub-) beams.

For the purposes of the invention, a patterned substrate with anti-reflective properties, referred to here as an anti-reflective glazing, describes a substrate, preferably an extensive and/or transparent substrate, with a periodic dot structure with structure widths in the micro- and sub-micrometer range, i.e. in the range from 50 nm to 50 µm. These anti-reflective properties are achieved when the dimensions of the generated structure, i.e. the structure period and dimensions of the individual cones, are in ranges smaller than the wavelength of visible light.

In physics, reflection is the bouncing back of an electromagnetic wave at an interface of materials with different refractive indices. The angle of reflection and the angle of transmission of light in transparent substrates can generally be calculated using Snellius' law of refraction as follows $$n_1 \sin \delta_1 = n_2 \sin \delta_2$$

where n1 and n2 indicate the refractive index of air and the substrate and $\delta 1$ and $\delta 2$ indicate the angles of the incident and reflected beam respectively.

Due to the periodic dot structure on the surface or in the volume of the substrate, preferably an extensive and/or transparent substrate, the refractive index of the substrate changes in such a way that a gradual refractive index ensues. As a result, light with wavelengths greater than the structural period A of the periodic dot structure is increasingly transmitted. Light with wavelengths shorter than or equal to the periodic dot structure is diffracted at the surface.

In the context of the invention, anti-reflective properties refer to periodic dot structures whose dimensions lie within the range of the incident electromagnetic wave, so that the incident wave is diffracted away from the observer in such a way that no reflection is perceived as "disturbing". In addition, the term anti-reflective properties in the sense of the invention also includes that the refractive index at the boundary between the first medium, for example air, and the substrate, preferably extensive and/or transparent substrate, is gradual, so that there is no clear transition from one medium to the other for the incident electromagnetic wave and the incident electromagnetic wave is increasingly transmitted.

For the purposes of the invention, a patterned substrate with anti-reflective properties also describes such a substrate which comprises a periodic dot structure, wherein the periodic dot structure consists of superimposed structures, wherein at least one structure has dimensions in the submicrometer range, and wherein at least one structure is formed from inverse cones (as defined herein), which can be generated in particular by interfering laser beams.

For example, the periodic dot structure, in particular the periodic dot structure consisting of superimposed structures, can be optimally adapted to the requirements of the respective application when interfering laser beams are used by configuring the parameters accordingly (selection of the laser radiation source, arrangement of the optical elements, pulse duration and intensity, number of laser pulses that hit an interference pixel).

For example, a structure with anti-reflective properties generated in this way is a periodic dot structure consisting of inverse cones with average dimensions in the micrometer range, in particular with an average distance in relation to their respective saddle point or center of height of 1 µm to 50 µm. A further structure is superimposed on this periodic dot structure, with the mean dimension of the superimposed structure preferably having dimensions in the range of the laser wavelength $\lambda$, or $\lambda/2$, in particular from 100 nm to 1000 nm, preferably 100 nm to 800 nm, particularly preferably 100 nm to 600 nm, in particular 100 nm to 400 nm. For the purposes of the invention, such a structure is also referred to as a hierarchical structure.

In particular, the superimposed structure has a quasi-periodic wave structure, wherein the material on the surface of the substrate in the region of the superimposed structure has a sequence of wave crests and wave troughs whose periodicity is in the submicrometer range, particularly preferably in the range from 100 nm to 1000 nm, preferably in the range from 100 nm to 800 nm, particularly preferably 100 nm to 600 nm, in particular 100 nm to 400 nm.

The wave structure is formed during the patterning process, i.e. when a laser pulse hits on the substrate to be structured as a result of the occurrence of a region of high intensity, the patterning taking place by means of a self-assembly process which is excited by the at least partial melting of the substrate material by means of a laser pulse in a region of high intensity. In particular, the wave structure is generated by utilizing laser-induced periodic surface structures (LIPSS), the occurrence of these surface structures being coupled to the generation of the periodic dot structures by means of interfering laser beams.

Alternatively, the wave structure, which is superimposed on the dot structure of inverse cones with average dimensions in the micrometer range according to the invention, can also be applied to the surface of the (pre-structured) substrate by subsequently applying a further interference pixel, whereby the structures generated with the further interference pixel have a structure period in relation to the cones formed by the further interference pixel in the statistical average range of 100 nm to 1,000 nm, preferably in the range from 100 nm to 800 nm, particularly preferably 100 nm to 600 nm, for example in the range from 200 nm to 500 nm, in particular in the range from 100 nm to 400 nm.

Advantageously, extensive patterning of a substrate, e.g. with anti-reflective properties by interfering laser beams and using laser-induced periodic surface structures, is thus possible without having to accept a long processing time or a high number of successively executable process steps. The invention thus enables the simultaneous generation of hierarchical structures which can be used in the technical field both in the area of substrates with anti-reflective properties and in the area of self-cleaning, hydrophobic or superhydrophobic, as well as hydrophilic or superhydrophilic substrates with anti-icing and/or anti-fogging properties.

According to a preferred embodiment of the present invention, the application of an interference pixel (or the interference volume that generates the interference pixel on or in the substrate), e.g. of a first, a second and/or a third interference pixel onto the surface or into the volume of the substrate by means of laser interference patterning is conducted by irradiating the substrate with several laser (sub-) beams at an angle to the surface of the substrate of 45° to 90° (perpendicular), preferably at an angle of 60° to 90°, particularly preferably at an angle of 75° to 90°, e.g. in an angle range of/to 90°. In each case in an angle range from/to 76°, 77°, 78°, 79°, 80°, 81°, 82°, 83°, 84°, 85°, 86°, 87°, 88°, 89°, 90° in each case in relation to the optical axis of the substrate. It is particularly preferred that an interference pixel is applied to the surface of a substrate essentially perpendicularly along a normal to the surface, i.e. at an angle of 90°+10.

Interference Region or Interference Pixel

The apparatus according to the invention is designed to generate a periodic dot structure in the micro- or sub-micrometer range on a substrate, wherein the periodic dot structure can be generated by laser beams interfering in an interference region.

The interference region is characterized by alternating radiation intensity maxima and minima occurring within its spatial extent. These maxima and minima occur with a periodic, i.e. repetitive regularity and thus form an interference pattern that can be transferred to the substrate. The interference region within which this pattern is recognizable is also referred to as the interference pixel. The extent of the interference pixel is typically circular, but other geometric extents, e.g. elliptical or linear extents, are also conceivable. The interference region within which the interference pattern is recognizable is physically defined by the intensity threshold of the substrate to be processed. The intensity threshold describes the energy at which the material of the substrate interacts with the incident laser beams, so that a change takes place within the material, e.g. melting or removal of the material. In the case of a laser radiation source with a Gaussian radiation profile, the energy of the interfering laser beams occurring at the maxima of the interference pattern decreases towards the edge of the interference region, so that the interference pixel applied to the substrate is smaller than the interference region, whereby the exact size is determined by the properties of the laser radiation source and the substrate.

Figure 6:
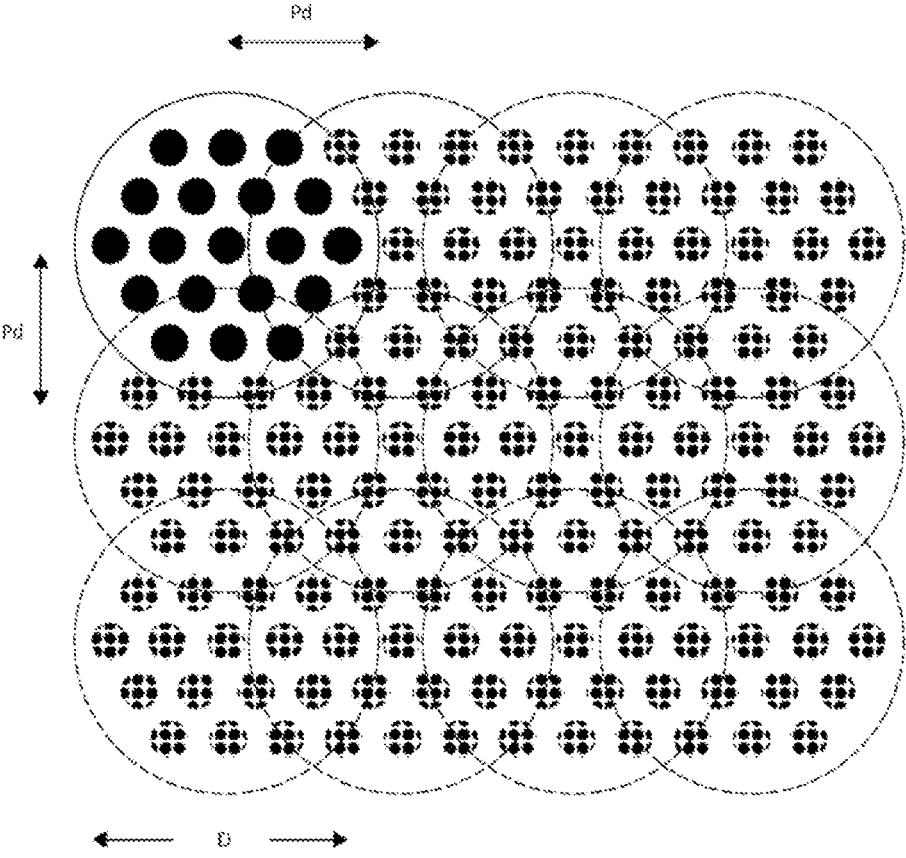

The term interference pixel, e.g. first, second, third and/or further interference pixel, thus refers in the sense of the present invention to a periodic pattern or grid of at least three inverse cones, preferably at least seven inverse cones, most preferably at least 19 inverse cones on the surface of a substrate, which are formed within an interference pixel (cf. FIG. 6). Preferably, the periodic pattern or grating is generated by superimposing at least three, particularly preferably at least four laser (sub-) beams as a result of focusing (bundling) these laser (sub-) beams onto the surface or into the interior of the substrate, whereby the sub-beams interfere constructively and destructively on the surface or in the interior of the substrate.

According to a preferred embodiment of the present invention, the structured substrate comprises not merely a single interference pixel of one type, for example a first interference pixel, a second interference pixel and/or a third interference pixel, but rather a plurality of interference pixels of one type, for example a plurality of first interference pixels and/or a plurality of second interference pixels are each arranged independently of one another within a plane in at least one spatial direction (x and/or y orientation), particularly preferably in two spatial directions (two-dimensionally), adjacent to one another in a repetitive offset manner. For example, it may be provided that in a first step at least a plurality of first interference pixels within a plane are applied to a plane on a surface or in the volume of the substrate to be structured (see, for example, FIG. 6), arranged in at least one spatial direction and repetitively offset relative to one another, and in a second step a plurality of second interference pixels within a plane are applied in at least the same spatial direction and repetitively offset relative to one another, superimposed on these plurality of first interference pixels. Nevertheless, it may be provided that these several first interference pixels and several second interference pixels are applied alternately, i.e. alternately— i.e. a first interference pixel, then a second interference pixel and again from the beginning—to the plane.

By arranging several first interference pixels and several second interference pixels, specific properties, in particular anti-reflective properties, can be achieved/applied over a large area, in particular over a plane of the substrate, which is spanned by a surface of the substrate, or within the volume of the substrate. Such patterning with several first interference pixels and several second interference pixels can be achieved, for example, by scanning the substrate with a polygon scanner.

Preferably, the periodic dot structures within one type of interference pixel have a coefficient of variation (a value resulting from dividing the standard deviation by the average value) of the cross-section of the cone of 15% or less, more preferably 10% or less, even more preferably 5% or less. This also allows better detectability of the substrate patterned according to the invention compared to conventional methods for patterning/coating substrates (e.g. etching, particle blasting, polymer coating), in which the deviations are larger due to the process and the structure period to be generated is less accurately mapped.

Laser Radiation Source

The apparatus according to the invention has a laser radiation source (1) that emits a laser beam. The radiation profile of the emitted laser beam corresponds either to a Gaussian profile or a top-hat profile, particularly preferably a top-hat profile. The top-hat profile is helpful in order to pattern or cover a substrate surface to be structured more homogeneously and, if necessary, to enable a faster patterning rate.

In a particularly preferred embodiment, the laser radiation source (1) is a source that generates a pulsed laser beam. The pulse width of the pulsed laser radiation source is, for example, in the range from 10 femtoseconds to 100 nanoseconds, in particular 50 femtoseconds to 10 nanoseconds, most preferably 50 femtoseconds to less than 100 picoseconds.

Unless expressly stated otherwise, the term laser beam or sub-beam does not refer to an idealized beam of geometric optics, but to a real light beam, such as a laser beam that does not have an infinitesimally small beam cross-section, but an extended beam cross-section (Gaussian distribution profile or an intrinsic top-hat beam).

Top-hat profile or top-hat intensity distribution refers to an intensity distribution that can essentially be described by a rectangular function (rect (x)), at least with regard to one direction. Real intensity distributions that show deviations from a rectangular function in the percentage range or sloping edges are also referred to as top-hat distributions or top-hat profiles. Methods and apparatuses for generating a top-hat profile are well known to those skilled in the art and are described, for example, in EP 2 663 892. Optical elements for transforming the intensity profile of a laser beam are also already known. For example, diffractive and/or refractive optics can be used to transform laser beams with a Gaussian-shaped intensity profile into laser beams that have a top-hat-shaped intensity profile in one or more defined planes, such as a Gauss-to-top hat focus beam shaper from TOPAG Lasertechnik GmbH, see e.g. DE102010005774A1. Such laser beams with top-hat-shaped intensity profiles are particularly attractive for laser material processing, especially when using laser pulses that are shorter than 50 ps, as the essentially constant energy or power density enables particularly good and reproducible processing results to be achieved.

The laser radiation source (1) comprised by the apparatus according to the invention can have an intensity of 0.01 to 5 J/cm², particularly preferably 0.1 to 2 J/cm², very particularly preferably 0.1 to 0.5 J/cm². The apparatus according to the invention allows the intensity of the laser radiation source to be flexibly selected within a range. The beam diameter plays no role in the generation of the interference pattern on the substrate, preferably extensive and/or transparent substrate. Due to the preferred arrangement of the optical elements in the optical path of the laser, no unit is required to control the intensity of the laser beam.

The laser radiation source is preferably configured to emit wavelengths in the range from 200 nm to 15 μm (e.g. CO2 lasers in the range from 10.6 μm), most preferably in the range from 266 nm to 1,064 nm. Suitable laser radiation sources include UV laser beam sources, laser radiation sources (155 to 355 nm) that emit green light (532 nm), diode lasers (typically 800 to 1000 nm) or laser radiation sources that emit radiation in the near infrared (typically 1064 nm), in particular with a wavelength in the range of 200 to 650 nm. Lasers suitable for microprocessing are known to the skilled person and include, for example, HeNe lasers, HeAg lasers (approx. 224 nm), NeCu lasers (approx. 249 nm), Nd:YAG lasers (approx. 355 nm), YAG lasers (approx. 532 nm), InGaN lasers (approx. 532 nm).

According to a further embodiment, the apparatus according to the invention has at least one further laser radiation source which is designed such that it generates a laser beam which interferes with the laser beam of the first laser radiation source or the laser beam of the first laser radiation source, which is divided into sub-beams, in an interference region. The additional laser radiation source has the same properties as described above, although these may be similar to or different from those of the first laser radiation source.

Optical Elements

The present invention comprises a plurality of optical elements. These elements are primarily prisms and lenses.

These lenses can be refractive or diffractive. Spherical, aspherical or cylindrical lenses can be used. In a preferred embodiment, cylindrical lenses are used. This makes it possible to compress the overlapping areas of the sub-beams (also referred to herein as interference pixels) in one spatial direction and stretch them in another. If the lenses are not spherical/aspherical but cylindrical, this has the advantage that the beams can be deformed at the same time. This allows the processing spot (i.e. the interference pattern created on the substrate) to be deformed from a point to a line containing the interference pattern. With sufficient energy from the laser, this line can be in the range of 10-15 mm long (and approximately 100 μm thick).

Furthermore, Spatial Light Modulators (SLM) can be used for beam shaping. The use of SLMs for spatial modulation of the phase or the intensity or the phase and intensity of an incident light beam is known to the person skilled in the art. The use of Liquid Crystal on Silicon (LCoS) SLMs for beam splitting is described in the literature and is also conceivable in the apparatus according to the invention. In addition, SLMs can also be used to focus the sub-beams on the substrate. Such an SLM can be controlled optically, electronically or acoustically.

All the optical elements described below are arranged in the optical path (3) of the laser. For the purposes of the invention, the optical path of the laser refers to the path of both the laser beam emitted by the laser radiation source and the path of the sub-beams split by a beam splitter element. However, the optical axis of the optical path (3) is understood to be the optical axis of the laser beam emitted by the laser radiation source (1). Unless otherwise explained, all optical elements are arranged perpendicular to the optical axis of the optical path (3).

Beam Splitter Element

A beam splitter element (2) is located in the optical path (3) of the laser, behind the laser radiation source (1). The beam splitter element (2) can be a diffractive or a refractive beam splitter element. Diffractive beam splitter elements are also referred to as diffractive optical elements (DOE) for short. For the purposes of the invention, a diffractive beam splitter element refers to an optical element which contains microstructures or nanostructures, preferably microstructures, which split an incoming beam into different beams according to the different diffraction orders. For the purposes of the invention, a refractive beam splitter element refers to a beam splitter element in which the beams are split on the basis of refractive index differences at surfaces, these usually being transparent optical elements, such as a prism or a double prism. Preferably, the beam splitter element (2) is a diffractive optical beam splitter element.

According to a preferred embodiment, the beam splitter element is a single optical element, in particular a diffractive or refractive optical element, which is constructed in such a way that the subdivision of the incident laser beam is based on the optical properties of the beam splitter element. This advantageously ensures that a simpler optical structure can be realized compared to a multi-part beam splitter element, which consists of several optical elements (e.g. mirrors, prisms, etc.). The desired beam splitting can be achieved without the need to calibrate or adjust the arrangement of several optical elements in relation to each other. The mobility of the beam splitter element in the optical path is also easy to realize, as only a single optical element needs to be moved. In addition, the use of a one-piece beam splitter element results in less components that are susceptible to wear and may need to be replaced.

According to one possible embodiment, the beam splitter is designed as a polarizing beam splitter, in which one of the resulting beams has a different polarization than the other, or as a non-polarizing beam splitter, in which the polarization plays no role in the splitting of the beam.

In a preferred embodiment, the beam splitter element (2) splits the emitted laser beam into at least 3, preferably at least 4, in particular 4 to 8, i.e. 4, 5, 6, 7 or 8 sub-beams.

In a further embodiment, the beam splitter element (2) splits the emitted laser beam into at least 2, preferably at least 3 to 4, in particular 4 to 10, i.e. 4, 5, 6, 7, 8, 9 or 10 sub-beams.

The beam splitter element (2) is freely movable along its optical axis. In other words, it can be moved along its optical axis towards or away from the laser radiation source. The movement of the beam splitter element (2) changes the expansion of the at least 3 sub-beams so that they hit a focusing element at different distances from each other. As a result, the angle θ at which the sub-beams hit the substrate (5), preferably extensive and/or transparent substrate, can be changed. This results in a seamless change in the structure period A from a superposition of four sub-beams to $$\Lambda = \frac{\lambda}{\sqrt{2}\sin\theta}$$

where λ is the wavelength of the emitted laser beam.

According to a preferred embodiment of the present invention, the beam splitter element is designed as a rotating element. This advantageously allows the polarization of the sub-beams to be modified.

Particularly preferably, the angle θ at which the partial beams hit the substrate (5), preferably extensive and/or transparent substrate, is 0.10 to 89.9°, preferably 5° to 85°, particularly preferably 10° to 60°, most preferably 15° to 45°.

The angle θ is also dependent on the distances between the optical elements, in particular the distance between the optical elements and the beam splitter element, especially the distance between the focusing element and the beam splitter element. Depending on the desired structure period to be generated on or in the extensive and/or transparent substrate, the position of the beam splitter element can be adjusted or calculated in such a way that the desired structure period can be set. The position of the optical elements comprised by the apparatus, in particular the position of the focusing element in relation to the beam splitter element, is taken into account in such a way that the position of the beam splitter element can be adjusted accordingly if the distance between the optical elements is greater or smaller.

In order to generate a patterned substrate with anti-reflective properties, it has been found to be particularly advantageous if a distance of 10 to 300 nm is set from the beam splitter element (2) to the deflecting element (7).

According to one embodiment, dot-shaped structures which have small structure periods, preferably in the statistical mean in the range from 100 nm to 1,000 nm (or as further defined herein), can be generated directly by applying an interference pattern, wherein the distance between the beam splitter element (2) and the deflecting element (7) is large, e.g. in the range from 40 mm to 200 mm, in particular 80 mm to 150 mm.

According to a further embodiment, dot-shaped structures which have small structure periods, preferably in the statistical mean in the range from 100 nm to 1,000 nm (or as further defined herein), can be generated by a self-organization process of the LIPSS, wherein the distance between the beam splitter element (2) and the deflecting element (7) is small, e.g. in the range from 1 mm to 100 mm, in particular 50 mm to 75 mm, especially preferably 10 to 50 mm. In this way, by directly applying an interference pattern, an interference pattern can be generated which has large structure periods on which the dot structure in the submicrometer range (as defined herein) is superimposed.

According to a preferred embodiment of the invention, the apparatus also comprises a measuring device, in particular a measuring device which operates by means of a laser or an optical sensor, which is configured to measure the position of the beam splitter element and, if appropriate, the distance of the beam splitter element from the other optical elements, in particular the position of the focusing element.

Furthermore, the apparatus according to the invention can comprise a control device which is connected to the measuring device in terms of signal technology and which is connected in particular to a computing unit in such a way that the measured position of the beam splitter element can be compared with a first predetermined comparison value, the control device being configured in terms of programming so that, if the distance of the beam splitter element to the other optical elements, in particular the position of the focusing element and/or the deflecting element (7) is greater or smaller than the first predetermined comparison value, then a control signal is generated via the control device, with which at least one position of an optical element, in particular of the beam splitter element (2), is changed in such a way, in particular of the beam splitter element (2) in relation to the deflecting element (7), that the desired structure period is generated on the substrate.

In this context, the method for producing a substrate with a dot structure in the micro- or submicrometer range, in particular after step (a), can also comprise the following steps:

(i) measuring the position of the beam splitter element (2) and, if necessary, the distance of the beam splitter element to the further optical elements or to at least one of the further optical elements, in particular to the position of the focusing element (4) and/or the deflecting element (7), (ii) comparing the measured position of the beam splitter element with a first predetermined reference value, and (iii) if the measured distance of the beam splitter element to the other optical elements or to at least one of the other optical elements, in particular to the position of the focusing element (4) and/or the deflecting element (7), is greater or smaller than the first predetermined reference value: changing the position of the optical element, in particular of the beam splitter element (2) (in particular in relation to the other optical elements, especially preferably of the beam splitter element (2) in relation to the deflecting element (7)), in such a way that the desired structure period is produced on the substrate.

The laser beam division within the beam splitter element (2) can be conducted either by a partially reflective beam splitter element, for example a semi-transparent mirror, or by a transmissive beam splitter element, for example a dichroic prism.

In a preferred embodiment, further beam splitter elements are arranged in succession of the beam splitter element (2) in the optical path of the laser. These beam splitter elements are arranged in such a way that they split each of the at least three sub-beams into at least two further sub-beams. This allows a higher number of sub-beams to be generated, which are directed onto the substrate, preferably extensive and/or transparent substrate, so that they interfere on the surface or inside the substrate. This allows the structure period of the interference pattern to be adjusted.

Focusing Element (4)

Furthermore, a focusing element (4) is arranged in succession of the beam splitter element (2) in the optical path (3) of the laser, which is configured so that the sub-beams pass through it in such a way that the sub-beams interfere on the surface or inside a substrate (5) to be structured in an interference region. The focusing element (4) focuses the at least three sub-beams in a spatial direction without focusing the at least three sub-beams in the spatial direction perpendicular thereto. For example, the focusing element (4) can be a focusing optical lens. In the context of the invention, focusing means bundling the at least three sub-beams on the surface or inside a substrate, preferably extensive and/or transparent substrate.

The focusing element (4) can be freely movable in the optical path (3). According to a preferred embodiment of the present invention, the focusing element (4) is fixed in the optical path or along the optical axis.

It is understood that the optical elements defined herein can, for example, be arranged in a common housing for beam splitting and for aligning the sub-beams in the direction of a substrate to be structured accordingly.

In a preferred embodiment, the focusing element (4) is a spherical lens. The spherical lens is configured so that the incident at least three sub-beams pass through it in such a way that they interfere in an interference region on the surface or inside the substrate (5) to be structured, preferably extensive and/or transparent substrate. The width of the interference region is preferably 1 to 600 μm, particularly preferably 10 to 400 μm, most preferably 20 to 200 μm. In this way, a high patterning rate, for example as defined herein, can be set at the same time.

In a particularly preferred embodiment, the focusing element (4) is a cylindrical lens. The cylindrical lens is configured so that the area in which the at least three sub-beams overlap on the surface or inside the substrate (5), preferably extensive and/or transparent substrate, is stretched in a spatial direction. As a result, the area of the substrate on which the interference pattern can be generated takes on an elliptical shape. The large half-axis of this ellipse can reach a length of 20 μm to 15 mm. This increases the area that can be structured within one irradiation.

First Deflecting Element

In a particularly preferred embodiment, a deflecting element (7) is located before the focusing element (4) and in succession of the beam splitter element (2), which is preferably arranged in the optical path (3) of the laser. This deflecting element (7) is used to widen the distances between the at least three sub-beams and can thus also change the angle at which the sub-beams hit the substrate (5), preferably extensive and/or transparent substrate. It is configured so that it increases the divergence of the at least three sub-beams and thus moves the area in which the at least three sub-beams interfere along the optical axis of the optical path (3) away from the laser radiation source (1).

In the context of the invention, widening the distances between the at least three sub-beams is understood to mean that the angle of the respective sub-beams to the optical axis of the laser beam emitted by the laser radiation source (1) is increased.

The widening and the resulting deflection of the sub-beams has the advantage that the sub-beams can be bundled more strongly by the focusing element (4). This results in a higher intensity in the area in which the at least three sub-beams interfere on the surface or inside the substrate (5), preferably extensive and/or transparent substrate.

The appropriate choice of deflecting element means that a unit for controlling the intensity of the laser beam can be dispensed with. In a preferred embodiment of the apparatus, a deflecting element (7) is used which, by expanding the at least three sub-beams, allows the at least three sub-beams to be focused on the substrate (5) by means of a focusing element (4), whereby the intensity of the interference points on the surface or inside the substrate, preferably extensive and/or transparent substrate, can be achieved without additional adjustment of the intensity of the laser radiation source (1). This has the advantage that laser radiation sources with low intensity (power per area) can also be used for patterning the substrate while generating the periodic dot structure, whereby the optical elements are protected against wear.

Further Deflecting Element

Furthermore, it can be provided that a further deflecting element (6) is arranged in succession of the beam splitter element (3) in the optical path (3) of the laser radiation source (1), which deflects the sub-beams in such a way that they run essentially parallel to one another after emerging from the further deflecting element (6). As a result, the apparatus can be configured so that the processing point, i.e. the point at which the at least three sub-beams interfere on the surface or inside the substrate, preferably extensive and/or transparent substrate, remains constant when the beam splitter element is moved in the optical path of the laser along its optical axis. The term "essentially parallel" should be understood in the context of this document to mean an angular offset of between +150 and −15°, in particular only between +10° and −10°, very preferably between +5° and −5° between the two sub-beams, but in particular of course a very small angular offset, i.e. +1° to −1°. Ideally, the angular offset is 0°, although slight deviations are possible due to manufacturing tolerances of the optical elements.

The further deflecting element (6) can be a conventional refractive lens. Alternatively, however, the further deflecting element (6) can also be designed as a diffractive lens (e.g. Fresnel lens). Diffractive lenses have the advantage that they are considerably thinner and lighter, which simplifies miniaturization of the apparatus disclosed herein.

By appropriately selecting the refractive indices of the optical elements (4), (6) and (7), the distances between the optical elements and the substrate as well as the structure period A can be adjusted. All optical elements, with the exception of the beam splitter element (2), can preferably be fixed within the optical path (3) of the laser. This particularly preferred embodiment therefore offers the advantage that only one element, namely the beam splitter element (2), needs to be moved to adjust the interference region or the interference angle. This saves process steps when configuring the apparatus, such as calibrating the apparatus to the desired structure period. Furthermore, a fixed setting, i.e. where preferably all optical elements are fixed within the optical path (3) of the laser, prevents wear of the optical elements.

Polarization Element

In a further embodiment, a polarization element (8) is located behind the deflecting element, particularly preferably in a setup with two deflecting elements (6), (7) behind the further deflecting element (6), and in front of the focusing element (4) in at least one of the optical paths of the at least 3 sub-beams there is one polarization element per sub-beam. The polarization elements can modify the polarization of the sub-beams relative to one another. This allows the resulting interference pattern, which the at least 3 sub-beams map on the surface or in the volume of a substrate, preferably extensive and/or transparent substrate, to be modified. By arranging a polarization element (8) in at least one of the optical paths of the sub-beams, preferably not in each optical path of the sub-beams, preferably in an optical path up to (n−1) optical paths, where n is the number of sub-beams generated in the application process, the polarization plane of at least one sub-beam in the beam path can be advantageously rotated and thus the pattern of an interference pixel in the plane of the substrate can be "disturbed".

In particular, the interfering sub-beams can therefore be non-polarized, linearly polarized, circularly polarized, elliptically polarized, radially polarized or azimuthally polarized.

Optical Element for Beam Shaping

In a further embodiment, the laser radiation source (1) has a radiation profile that corresponds to a Gaussian profile as described above. In such an embodiment, a further optical element for beam shaping can be located behind the laser radiation source (1) and in front of the beam splitter element (2). This element is used to adjust the radiation profile of the laser radiation source (1) to a top-hat profile.

An optical element with a concave parabolic or planar reflective surface can also be provided in the apparatus according to the invention, whereby the optical element is designed to be rotatable about at least one axis or displaceable along the optical path (3), for example. As a result, an additional focusing element (4) positioned in the optical path (3) or an additional deflecting element (6) can be dispensed with if necessary. For example, this optical element can be used to direct laser beams or laser sub-beams onto the surface of the focusing element (4) or another focusing optical element before the beams reach the substrate to be patterned to form structure elements.

Alternatively, for example, at least one optical element with a concave parabolic or planar reflective surface can also be provided, which is designed to be rotatable about at least one axis or displaceable along the optical path (3), for example, this optical element being positioned in succession of the first deflecting element (7) and the further deflecting element (6) in the optical path. For example, the sub-beams can be deflected in the optical path (deflecting mirror) or focused in the optical path in such a way that the substrate to be patterned can be positioned in a fixed position during processing (so-called focusing mirror or galvo mirror (laser scanner) (9)).

An embodiment comprising a polygon scanner is also conceivable. In this embodiment, at least one optical element comprises a periodically rotating prism, preferably a periodically rotating mirror prism, in particular a polygon mirror or polygon wheel, as well as a focusing element (4) arranged in succession of the periodically rotating prism in the optical path. The focusing element is configured so that the sub-beams pass through it in such a way that the sub-beams interfere on the surface or inside a substrate (5) to be patterned in an interference region. In a preferred embodiment, the optical element further comprises at least one further deflecting element, for example a reflective deflecting element for deflecting the sub-beams in the optical path. The at least one further deflecting element can be arranged preceding and/or in succession of the periodically rotating prism in the optical path. The at least one further deflecting element is arranged preceding of the focusing element in the optical path.

Such a setup advantageously allows a surface of a substrate to be scanned quickly, so that a high patterning rate of up to 3 $m^2$/min, in particular in the range of 0.05 to 2 $m^2$/min, especially preferably in the range of 0.1 to 1 $m^2$/min, most preferably in the range of 0.1 to 0.9 $m^2$/min can be achieved. The exact patterning rate depends in particular on the available laser power. With future technologies that have a higher laser power, even higher patterning rates can therefore be achieved.

Holding Device for the Substrate

In a further embodiment, the substrate (5), preferably extensive and/or transparent substrate, is movable in the xy plane. By moving the substrate (5), preferably extensive and/or transparent substrate, in the xy plane, extensive processing by means of laser interference patterning can be ensured. In each processing step (i.e. laser pulse that hits the substrate to be patterned), an interference pixel (as defined herein) is generated, which has a size D depending on the angle of incidence and the intensity distribution of the laser beam, as well as the focusing properties of the optical elements. The distance between the different interference pixels, the pixel density Pd, is determined by the repetition rate of the laser radiation source (1) and the movement of the substrate in relation to the focusing point of the optical elements, i.e. the point at which the interference region is generated on the surface or inside the substrate. If the pixel density Pd is smaller than the size of the interference pixels D, homogeneous processing over a large area is possible.

By moving the substrate in relation to the focusing point (which generates the interference pixel) in combination with pulsed laser (sub-) beams, an extensive, optionally homogeneous and periodic dot structure can be generated on the surface or inside a substrate, preferably extensive and/or transparent substrate.

As an alternative to moving the substrate in relation to the focusing point, the focusing point can also be moved over the sample or the substrate (e.g. using scanner-based methods).

Moving the substrate to be patterned, preferably extensive and/or transparent substrate, in the laser beam can be comparatively time-consuming and slow due to the relatively large masses moved in the process. It is therefore advantageous to provide the substrate, preferably extensive and/or transparent substrate, in a fixed position during processing and to realize the extensive patterning of the substrate by focusing the sub-beams on the surface or the volume of the substrate by manipulating the sub-laser beams with optical elements (focusing mirrors or galvo mirrors (laser scanners)) in the beam direction. As the masses moved in this process are relatively small, this is possible with far less effort, which is to say much faster. Preferably, the substrate is stationary during the process.

Method

The present invention also includes a method for producing a substrate, preferably extensive and/or transparent substrate, with a periodic dot structure in the micro- or submicrometer range by means of laser interference patterning.

In accordance with the invention, the method for producing a patterned substrate, preferably extensive and/or transparent substrate, with a periodic dot structure in the micro- or submicrometer range by means of laser interference patterning, comprises the following steps:

A substrate (5), preferably extensive and/or transparent substrate, is provided, which is located on a holding device. A laser beam is emitted from a laser radiation source (1). The laser beam is divided by a beam splitter element (2) and at least three, preferably four, sub-beams. The sub-beams hit a focusing element (4), which focuses (bundles) the at least three, particularly preferably four sub-beams on the surface or inside the substrate (5), preferably extensive and/or transparent substrate, so that the sub-beams interfere constructively and destructively on the surface or inside the substrate. Thus, a periodic dot structure in the micro- or sub-micrometer range is generated on the surface or inside the substrate (5), preferably extensive and/or transparent substrate, by laser interference processing. The method is characterized in that the at least three sub-beams are superimposed in such a way that a 2D pattern is created.

According to a further embodiment of the invention, the laser beam is divided into at least 2 sub-beams by the beam splitter element. The sub-beams hit a focusing element (4), which focuses (bundles) the at least three, particularly preferably four sub-beams on the surface or inside the substrate (5), preferably extensive and/or transparent substrate, so that the sub-beams interfere constructively and destructively on the surface or inside the substrate. Thus, a periodic dot structure in the micro- or sub-micrometer range is generated on the surface or inside the substrate (5), preferably extensive and/or transparent substrate, by laser interference processing. The method is characterized in that the at least three sub-beams are superimposed in such a way that a 1D pattern, in particular a line pattern, is produced.

The dot structures generated in this way are in the form of periodically arranged, inverse cones, with the distance between the vertices (i.e. center of elevation or centers of the elevations) in the statistical mean in the range from 50 nm to 50 μm, preferably in the range from 50 nm to 20 μm, particularly preferably in the range from 100 nm to 4 μm, more preferably in the range from 100 nm to 2 μm, even more preferably in the range from 200 nm to 1.5 μm, very particularly preferably in the range from 300 nm to 800 nm.

The inventors of the present invention have further found that, in addition to periodicity, the structure depth (i.e., the depth of the inverse cones measured from their saddle point of the indentation to the apex) or profile depth have an influence on the anti-reflective properties (as defined herein). For example, the structure depth or profile depth of the inverse cones (elevations and depressions) is on statistical average in the range from 5 nm to 500 nm, preferably in the range from 5 nm to 300 nm, most preferably in the range from 5 nm to 100 nm, even more preferably in the range from 5 nm to 75 nm. The structure depth of the inverse cones of an interference pixel is generally described by the mean structure depth (d50), which defines the 50% proportions of cones within an interference pixel with a certain structure depth smaller or larger than the specified value for the structure depth.

According to a preferred embodiment of the present invention, the inverse cones have a structure depth in the range from 5 nm to 200 nm, particularly preferably in the range from 5 nm to 150 nm, most preferably 10 nm to 100 nm.

Preferably, an apparatus is used to produce a patterned substrate (5), preferably extensive and/or transparent substrate, which comprises two deflecting elements (6), (7). The deflecting elements (6), (7) are arranged in the optical path (3) of the laser between the beam splitter element (2) and the focusing element (4). The deflecting elements (6), (7) serve to widen the diffraction angle of the at least three, particularly preferably four sub-beams, in which they interfere on the surface or in the interior of the substrate (5), preferably extensive and/or transparent substrate. By adjusting the distances between the optical elements, it can be ensured that only the beam splitter element (2) needs to be movable along its optical axis in order to change the structure period. This enables easier adjustment processes during machining.

In a particularly preferred embodiment, a transparent material is provided as an extensive substrate. Due to the translucency of the transparent material, laser interference processing inside the substrate is possible, preferably with an embodiment of the above-mentioned apparatus.

In a preferred embodiment, an apparatus is used for producing a patterned substrate, preferably extensive and/or transparent substrate, which uses a pulsed laser radiation source (1). In a particularly preferred embodiment, an apparatus for producing a patterned substrate, preferably extensive and/or transparent substrate, is used which has a holding device for the substrate which is freely movable in the xy plane, perpendicular to the optical path (3) of the laser beam emitted by the laser radiation source (1).

The pixel density Pd, i.e. the distance at which an interference pixel of width D can be applied to the substrate, preferably extensive and/or transparent substrate, can be adjusted via the frequency of the laser radiation source (1), f, and the speed of movement of the holding device, v:

$$Pd = v/f$$

If the width of the interference pixel, D, is greater than the pixel density Pd, neighboring interference pixels overlap within an area. This area is known to the skilled person as the pulse overlap, OV. It can be calculated as:

$$OV = (D - Pd)/D$$

In a preferred embodiment, in the process for producing a patterned substrate, preferably extensive and/or transparent substrate, Pd is smaller than D. The resulting pulse overlap OV leads to multiple irradiation of the substrate, preferably extensive and/or transparent substrate. Preferably, non-textured surfaces can thus be avoided.

In a particularly preferred embodiment, the same interference pixels are irradiated several times in the process for producing a patterned substrate, preferably extensive and/or transparent substrate. This makes it possible to increase the depth of the resulting microstructures.

The advantage of a patterned substrate, preferably extensive and/or transparent substrate, produced by such a method is the high regularity of the generated periodic dot structures with structure dimensions in the micrometer or submicrometer range. A periodic dot structure produced in this way with dimensions in the micro- or sub-micrometer range preferably has a coefficient of variation (a value resulting from dividing the standard deviation by the average value) of the cone cross-section of 15% or less, more preferably 10% or less, even more preferably 5% or less.

Multiple irradiation of a substrate is particularly suitable for producing hierarchical structures. Multiple irradiation of the same interference pixel causes at least partial melting of the substrate material, whereby a wave structure is formed during the patterning process, i.e. when a laser pulse hits the substrate, as a result of the occurrence of a high intensity region. The structure, in particular the wave structure, is formed by a self-assembly process. In particular, the wave structure is superimposed on a periodic dot structure in the micro- or sub-micrometer range, which can be generated by means of laser interference patterning. Thus, a hierarchical patterning can be generated in a substrate with one process step. According to a preferred embodiment of the invention, multiple irradiation, preferably 2-fold to 400-fold, in particular 20-fold to 300-fold, particularly preferably 50-fold to 200-fold irradiation of the same interference pixel is therefore carried out on the substrate, whereby a wave structure (as defined herein) is formed, in particular a periodic dot structure is formed from superimposed structures, wherein at least one structure has dimensions in the submicrometer range, in particular a quasi-periodic wave structure, and wherein at least one structure is formed from inverse cones. The time offset between the individual pulses is particularly preferably in the range of the pulse duration of the laser pulse, preferably in the range from 1 fs to 100 ns, particularly preferably in the range from 10 fs to 10 ns, very particularly preferably in the range from 10 fs to 15 ps.

Hierarchical patterning refers to a pattern in which a first structure with dimensions in the micro- or submicrometer range, which corresponds to an interference pattern, is superimposed by a further structure which has dimensions which are below the dimensions of the first structure and which is formed by a self-assembly process. Preferably, the dimensions of the further structure, which is formed by a self-assembly process, are in the range of 1% to 30% of the dimensions of the first structure, which corresponds to an interference pattern.

There are numerous technical areas of application for hierarchical patterns, for example in the production of substrates with hydrophobic or superhydrophobic as well as hydrophilic or superhydrophilic surfaces and substrates with anti-icing or anti-fogging properties in addition to the substrates with anti-reflective properties mentioned at the beginning. Advantageously, a method for producing such hierarchical patterns, as described herein, enables the precise adjustment of the process parameters influencing the structure dimensions by a suitable selection of the laser radiation source and a corresponding displacement of the beam splitter element in the optical path of the laser.

In addition, the method defined herein makes it possible to provide a substrate with hierarchical patterns by means of the same apparatus and, moreover, in the same process step, whereas conventional processes proceed successively, i.e. are not capable of simultaneously generating a first structure with dimensions in the micro- or submicrometer range, which corresponds to an interference pattern, and a further structure, which is formed by a self-assembly process.

Moving the substrate to be patterned, preferably extensive and/or transparent substrate, in the laser beam is comparatively time-consuming and slow due to the relatively large masses moved in the process. It is therefore advantageous to provide the substrate, preferably extensive and/or transparent substrate, in a fixed position during processing and to realize the extensive patterning of the substrate by focusing the sub-beams on the surface or the volume of the substrate by manipulating the laser sub-beams with optical elements (focusing mirrors or galvo mirrors (laser scanners)) in the beam direction. As the masses moved in this process are relatively small, this is possible with far less effort or much faster. Preferably, the substrate is stationary during the process.

The two-dimensional patterning of the substrate is of course also possible in principle by moving the substrate in the laser beam.

Due to the periodic structures in the micro- and/or nanometer range produced by means of the method and apparatus disclosed herein, the substrate patterned in this way has anti-reflective properties. This is ensured by the fact that light incident on the substrate reflects less or reflects at such a flat angle that it does not have a "disturbing" effect when the material surface is viewed normally.

The invention therefore also covers a patterned substrate with anti-reflective properties which comprises a periodic dot structure in the micro- or sub-micrometer range, wherein the periodic dot structure is formed from inverse cones, wherein the inverse cones are periodically arranged with a spacing relative to their saddle point or center point in the range of 50 nm to 50 nm. center in the range from 50 nm to 50 μm, preferably in the range from 50 nm to 20 μm, particularly preferably in the range from 100 nm to 4 μm, more preferably in the range from 100 nm to 2 μm, even more preferably in the range from 200 nm to 1.5 μm, more preferably in the range from 100 nm to 1,000 nm, particularly preferably in the range from 300 nm to 800 nm.

According to a preferred embodiment of the invention, the patterned substrate is obtained by processing with a method as defined herein.

The present invention also relates to a method for producing a substrate having a periodic dot structure in the micro- or sub-micrometer range by laser interference patterning, in particular by a method disclosed herein, comprising the following steps:

a) applying a first pulse on the surface of a substrate (5), preferably by an apparatus as defined herein, which generates a first interference pixel on the surface of the substrate (5) or in the substrate (5), b) b) applying a second pulse on the surface of a substrate (5), preferably by an apparatus as defined herein, which generates a second interference pixel on the surface of the substrate (5) or in the substrate (5), wherein the first and second interference pixels each independently comprise a periodic dot structure with dimensions in the micro- and sub-micrometer range, characterized in that the offset between the second interference pixel and the first interference pixel is in the range of 10% 5×5 50% of the interference period.

This is particularly advantageous for creating a structure on the substrate, especially on a transparent substrate, which has anti-glare properties.

In the context of the invention, glare refers to the reflection of light from a light source (e.g. the sun) on a transparent substrate, e.g. a window or a screen, which can make it difficult to see what is happening on the screen.

These glare effects can be reduced with the help of an anti-glare treatment of the surfaces (typically produced by coatings in the state of the art). An anti-glare structure scatters incident light on the surface so that glare can be significantly reduced.

According to a preferred embodiment of the invention, the period of the dot structure of the first interference pixel and the period of the second interference pixel are identical.

In addition, it may be provided that after step b) a third pulse is applied on the surface of a substrate (5), preferably by an apparatus as defined herein, wherein the third interference pixel comprises a periodic dot structure with dimensions in the micro- and submicrometer range, wherein the third pulse generates a third interference pixel on the surface of the substrate (5) or in the substrate (5), wherein the third interference pixel has an offset in the range of $10\% \leq x \leq 50\%$ of the interference period with respect to the second interference pixel.

Patterned Substrate

The inventors have found that substrates patterned primarily by an apparatus or method disclosed herein are characterized by pronounced anti-reflective properties. The present invention therefore also relates to a patterned substrate having anti-reflective properties as defined herein, comprising a periodic dot structure in the micro- or submicrometer range, wherein the periodic dot structure is formed in particular from an inverse cone structure (also referred to herein as inverse cones), wherein the inverse cones are periodically spaced with respect to their saddle point or center in the range of 50 nm to 50 nm. center in the range from 50 nm to 50 μm, preferably in the range from 50 nm to 20 μm, particularly preferably in the range from 100 nm to 4 μm, more preferably in the range from 100 nm to 2 μm, even more preferably in the range from 200 nm to 1.5 μm, more preferably in the range from 100 nm to 1,000 nm, particularly preferably in the range from 300 nm to 800 nm.

The periodic dot structure generated in this way has the property that, depending on its structure dimensions, incoming electromagnetic radiation with wavelengths in the range from 10 nm to 1 mm can be increasingly transmitted or diffracted by the periodic structures, resulting in reduced reflection at the surface of the substrate. If the period of the generated periodic dot structures is in the range of the wavelength of the incident electromagnetic wave, it is diffracted at the surface of the substrate. If the period of the generated periodic dot structure is smaller than the wavelength of the incident electromagnetic wave, it is transmitted.

The periodic dot structure is preferably formed in such a way that the structured substrate transmits electromagnetic radiation with a wavelength of more than 550 nm at a periodic dot structure of less than 1,000 nm, preferably more than 500 nm at a periodic dot structure of less than 750 nm, most preferably more than 450 nm at a periodic dot structure of less than 600 nm. Depending on the structure depth of the inverse cones, wavelengths in the red and/or yellow light spectrum, the green light spectrum and even the blue light spectrum can be transmitted into the substrate.

The refractive index of the patterned substrate is gradual due to the periodic dot structure created. It decreases over the height of the structure so that there is no clear air-medium transition. This results in increased transmission of incident electromagnetic waves with a wavelength greater than the structural period of the generated dot structure, and diffraction of incident electromagnetic waves with a wavelength in the range of the structure period of the generated dot structure.

Due to the very small structure dimensions that can be produced, the apparatus and the method disclosed herein for producing an anti-reflection patterning are also suitable for producing surfaces with hydrophobic and/or superhydrophobic as well as hydrophilic and/or superhydrophilic properties.

Hydrophobic properties depend on both the chemical and the surface properties, in particular the surface roughness, of a substrate. The inventors have now surprisingly found that by the method according to the invention, in particular hydrophobic substrates can be obtained by the introduction of structures in the micrometer and submicrometer range, in particular superimposed structures (as defined herein) substrate surfaces are obtained which have superhydrophobic and self-cleaning properties. Substrates with superhydrophobic properties are particularly preferably substrates with a hierarchical surface patterning. Hierarchical surface patterning in this context means a surface on which there are regular structures with dimensions in the micrometer range, which in turn have a pattern on their surface with dimensions in the submicrometer range. Such hierarchical patterning can lead to a high surface roughness.

The inventors have also found that substrates patterned primarily by an apparatus or method disclosed herein are characterized by pronounced hydrophobic properties on the surface of a substrate. By means of the apparatus and method disclosed herein for generating anti-reflection patterns with dimensions in the micro- and submicrometer range, patterning is also possible for generating a surface patterning, in particular a surface roughness on the surface of a substrate, which results in the substrate having hydrophobic or superhydrophobic properties. Hydrophobic material properties can be generated by using direct laser interference-patterning to create a structure with dimensions in the micro- and/or sub-micrometer range. In a preferred embodiment, a structure with dimensions in the micrometer range is first created on the surface. Then, by moving the beam splitter element in the optical path of the laser, a structure with dimensions in the sub-micrometer range is generated on the surface of the first structure, preferably with multiple irradiation of the substrate. The hierarchical pattern generated in this way has hydrophobic or superhydrophobic properties.

To produce a substrate with hydrophobic properties, it is also conceivable that only a structure with dimensions in the micro- or sub-micrometer range is produced without moving the beam splitter element in an intermediate step.

Advantageously, substrates with hydrophobic and/or superhydrophobic properties can thus be produced by means of the same method and on the basis of the same apparatus in a technically easily realizable manner by producing a periodic dot structure in the micro- or submicrometer range and/or a periodic dot structure with a hierarchical pattern in the micro- and submicrometer range. By moving the beam splitter element, it is possible to realize at least two, but also any number of additional structures on the surface of the substrate without further changes to the structure, e.g. without replacing optical elements or moving the substrate. This increases both the precision in the alignment of the structures and the speed of the process compared to conventional methods or apparatuses.

The inventors have established a correlation between the surface properties of a substrate and the formation of ice on its surface. In particular, so-called anti-icing properties can be generated if the structure size on the surface of a substrate is sufficiently small. Research results have shown that a substrate with superhydrophobic properties can also exhibit anti-icing properties.

For the purposes of the invention, anti-icing properties are understood to mean that no or only very little water freezes on the surface of a substrate, this property being attributable to the surface properties, in particular the surface roughness.

Such a substrate can be advantageously used in the aerospace sector, in wind turbines, in the field of automotive components or also in telecommunications and antenna technology in order to protect exposed components from icing.

In one embodiment of the invention, the method and apparatus disclosed herein is suitable for producing a substrate comprising a periodic dot structure in the micro- or sub-micrometer range which has been produced by laser interference patterning and which is characterized by anti-reflective properties. In the sense of the invention, anti-reflective properties herein refer to the increased transmission or diffraction of incident electromagnetic radiation with wavelengths in the range of visible light, in particular with wavelengths in the range from 400 nm to 700 nm. The substrate is characterized by the fact that the periodic dot structure it comprises preferably has dimensions in the submicrometer range, particularly preferably in the nanometer range. Particularly preferred are the dimensions of the periodic dot structure in the range of the wavelength of electromagnetic radiation in the range of visible light. Thus, the dimensions of the periodic dot structure are preferably in the range from 630 nm to 700 nm for transmitting or diffracting red light, in the range from 590 nm to 630 nm for transmitting or diffracting red and orange light, in the range from 560 nm to 590 nm for transmitting or diffracting red, orange and yellow light, in the range from 500 nm to 560 nm for transmitting or diffracting red, orange, yellow and green light, in the range from 500 nm to 560 nm for transmitting or diffracting red, orange, yellow and green light, in the range from 475 nm to 500 nm for transmitting or diffracting red, orange, yellow, green and turquoise light, in the range from 450 nm to 475 nm for transmitting or diffracting red, orange, yellow, green, turquoise and blue light, in the range from 425 nm to 450 nm for transmitting or diffracting, orange, yellow, green, turquoise, blue and indigo-colored light and in the range from 400 nm to 425 nm for transmitting or diffracting red, orange, yellow, green, turquoise, blue, indigo-colored and violet light. The anti-reflective properties of the substrate can therefore be controlled by changing the dimensions of the periodic dot structure.

In one embodiment of the invention, the method and apparatus disclosed herein are suitable for producing a substrate comprising a periodic dot structure in the micro- or sub-micrometer range which has been produced by laser interference patterning and which is characterized by anti-reflective properties. In the sense of the invention, anti-reflective properties herein refer to the increased transmission or diffraction of incident electromagnetic radiation with wavelengths in the range of non-visible light, in particular in the range of infrared radiation, or thermal radiation, in particular with wavelengths in the range of 780 nm to 1 mm. The substrate is characterized by the fact that the periodic dot structure it comprises preferably has dimensions in the micrometer range. Advantageously, the heat transmission of the substrate can be adjusted by changing the dimensions of the periodic dot structure.

In one embodiment of the invention, the method and apparatus disclosed herein are suitable for producing a substrate comprising a periodic dot structure in the micro- or sub-micrometer range which has been produced by laser interference patterning and which is characterized by anti-reflective properties. In the sense of the invention, anti-reflective properties herein refer to the increased transmission or diffraction of incident electromagnetic radiation with wavelengths in the range of non-visible light, in particular in the range of ultraviolet radiation (IV radiation), in particular with wavelengths in the range of 100 nm to 380 nm. The substrate is characterized by the fact that the periodic dot structure it comprises preferably has dimensions in the nanometer range. A substrate patterned in this way can be used advantageously in areas where protection against UV radiation is required.

In a further embodiment of the invention, the method and apparatus disclosed herein are suitable for producing a substrate comprising hierarchical patterns which have been generated by laser interference patterning by multiple irradiation of the same interference pixel and which are characterized by hydrophobic or superhydrophobic properties. The hydrophobic or superhydrophobic properties are due to the fact that structures with dimensions in the micro- or sub-micrometer range, in particular hierarchical patterns with dimensions in the micro- and sub-micrometer range, change the wetting angle of liquids on substrates in such a way that it becomes larger. A larger wetting angle means that liquids hitting the surface do not wet it well and instead roll off it. A substrate treated in this way has self-cleaning and water-repellent properties. Particularly suitable materials for such a patterned substrate are materials that already have hydrophobic properties, e.g. metal or polymer surfaces.

In a further embodiment of the invention, the method and the apparatus disclosed herein are suitable for producing a substrate which has hierarchical patterns which have been produced by means of laser interference patterning by multiple irradiation of the same interference pixel and which are characterized by anti-icing properties, i.e. properties which prevent the formation of ice layers. The anti-icing properties are based on the fact that structures with dimensions in the micro- or sub-micrometer range, in particular hierarchical patterns with dimensions in the micro- and sub-micrometer range, change the wetting angle of liquids on substrates in such a way that it becomes larger. The patterned substrate thus exhibits hydrophobic or superhydrophobic properties. A larger wetting angle means that liquids hitting the surface do not wet it well and instead roll off it. This also makes it more difficult for layers of ice to deposit on the surface. Materials that already have hydrophobic properties, e.g. metal or polymer surfaces, are particularly suitable for such a patterned substrate.

In a further embodiment of the invention, the method and apparatus disclosed herein are suitable for producing a substrate comprising hierarchical patterns which have been generated by laser interference patterning by multiple irradiation of the same interference pixel and which are characterized by hydrophilic or superhydrophilic properties. The hydrophilic or superhydrophilic properties are due to the fact that structures with dimensions in the micro- or sub-micrometer range, in particular hierarchical patterns with dimensions in the micro- and sub-micrometer range, change the wetting angle of liquids on substrates in such a way that it becomes smaller. A smaller wetting angle means that liquids hitting the surface wet it very well and there is no droplet formation. Instead, uniform wetting is achieved, which does not impair the transparency of the substrate. Particularly suitable materials for such a patterned substrate are those that already have hydrophilic properties, e.g. glass surfaces.

In a further embodiment of the invention, the method and apparatus disclosed herein are suitable for producing a substrate which has hierarchical patterns which have been produced by means of laser interference patterning by multiple irradiation of the same interference pixel and which are characterized by anti-fogging, i.e. non-fogging properties. The anti-fogging properties are based on the fact that structures with dimensions in the micro- or sub-micrometer range, in particular hierarchical patterns with dimensions in the micro- and sub-micrometer range, change the wetting angle of liquids on substrates in such a way that it becomes smaller. The structured substrate thus exhibits hydrophilic or superhydrophilic properties. A smaller wetting angle means that liquids hitting the surface wet it very well and there is no droplet formation. Instead, uniform wetting is achieved, which does not impair the transparency of the substrate. Particularly suitable materials for such a patterned substrate are materials that already have hydrophilic properties, e.g. glass surfaces. A substrate patterned in this way can be used advantageously in the automotive and aerospace industries, but also generally for glazing in building technology.

In one embodiment of the invention, the method and apparatus disclosed herein is suitable for producing a substrate comprising a micro- or sub-micrometer periodic dot structure produced by laser interference patterning, which has an increased surface roughness. The increased surface roughness is based on the fact that the surface texture is changed in the micro- or submicrometer range by the periodic dot structure introduced into the substrate, in particular on the fact that the surface of the substrate has elevations and depressions due to the periodic dot structure introduced. In particular, an increased surface roughness can be achieved by patterning a substrate by means of the method and apparatus described herein with hierarchical patterns with dimensions in the micro- and submicrometer range by means of laser interference patterning through multiple irradiation of the same interference pixel. A substrate processed in this way can be used advantageously in the field of manufacturing, for example to increase the static friction and/or sliding friction between technical components, or in medical technology to increase the adhesion of cells on an external surface.

In one embodiment of the invention, the method and apparatus disclosed herein are suitable for generating a substrate comprising a periodic dot structure in the micro- or sub-micrometer range generated by laser interference patterning, which has an increased surface area compared to an unpatterned substrate with the same outer dimensions. The periodic dot structure in the micro- or submicrometer range contributes to the fact that the surface area of the substrate increases proportionally to the density of the interference regions per interference pixel. In particular, an increased surface area compared to an unpatterned substrate with the same outer dimensions can be achieved by patterning a substrate by means of the method and apparatus described herein with hierarchical patterns with dimensions in the micro- and submicrometer range by means of laser interference patterning through multiple irradiation of the same interference pixel. A substrate processed in this way can be used advantageously in technical areas with a requirement for high heat transfer, since the increased surface area provides a greater capacity for heat exchange compared to an unpatterned substrate with the same external dimensions. Furthermore, a substrate processed in this way can be used in the field of electrical connection technology to reduce contact resistance, as the increased surface area means that more contact points can be produced between materials to be contacted compared to an unpatterned substrate with the same external dimensions. In addition, a substrate patterned in this way can be used in the field of battery technology, in particular for patterning the anode and cathode, as the increased surface area means that there is more capacity for exchanging charge carriers between the metal of the electrodes compared to an unpatterned substrate with the same external dimensions.

Furthermore, the method and the apparatus disclosed herein are suitable for producing a substrate comprising a periodic dot structure with dimensions in the micro- or submicrometer range, which has antibacterial (antiseptic) properties. In a preferred embodiment, the periodic dot structure has dimensions which are significantly larger, at least 10% to 30% larger, than the bacteria deposited on it. This isolates the bacteria deposited on the surface and thus renders them harmless. In a particularly preferred embodiment, the periodic dot structure has dimensions that are significantly smaller, at least 10% to 30% smaller, than the bacteria deposited on it. This prevents the bacteria from adhering to the surface and keeps the surface sterile.

A patterned substrate produced by the method and apparatus disclosed herein is furthermore suitable for further processing by means of a further coating process, wherein the substrate may receive a physical and/or chemical coating. Such a coating can enhance the properties of the patterned substrate, for example the anti-reflective properties and/or hydrophilic and/or hydrophobic properties. The application of a chemical spray coating and/or the application of a coating by means of chemical vapor deposition and/or sputtering and/or sol-gel processes is conceivable.

According to a preferred embodiment of the present invention, the patterned substrate comprises a dot structure formed of a first and a second interference pixel, wherein the first and the second interference pixel each independently comprise a periodic dot structure with dimensions in the micro- and submicrometer range, wherein the first interference pixel and the second interference pixel are arranged superimposed to each other in such a way that the offset between the second interference pixel and the first interference pixel is in the range of $10\% \leq x \leq 50\%$, in particular in the range of $20\% \leq x < 50\%$, particularly preferably in the range of $25\% \leq x \leq 45\%$ of the interference period. This is particularly advantageous, especially with the dimensions of the dot structures defined herein (regardless of their area of application) on the substrate, in particular on a transparent substrate, a patterning can be produced that has anti-glare properties.

According to a preferred embodiment of the invention, the periodic dot structure is designed such that at least a third interference pixel is arranged superimposed on the first and second interference pixels such that the offset between the third interference pixel and the second interference pixel is in the range of $10\% \leq x \leq 50\%$, in particular in the range of $20\% \leq x < 50\%$, particularly preferably in the range of $25\% \leq x \leq 45\%$ of the interference period.

Use of the Patterned Substrate

The patterned substrate with anti-reflective properties defined herein is used, for example, in photovoltaic systems, whereby the efficiency of these photovoltaic systems can be significantly increased by introducing anti-reflective properties. A major challenge in the field of photovoltaic systems lies in the large losses caused by the reflection of the sun's rays. On average, reflections cause 40% energy/power losses per system. The efficiency of photovoltaic systems must therefore be constantly improved. One of the most promising approaches is the reduction of reflection with the help of anti-reflective coatings and/or texturing of the surface. The use of the process disclosed herein simplifies, accelerates and improves the treatment of surfaces.

It is also known that monitors and screens are often placed in fixed locations and are therefore susceptible to unfavorable light incidence, which leads to visual problems for the viewer. Although there are ways to minimize this effect, these approaches are not widely used as they tend to alleviate the symptoms rather than actually solve the problem. The patterned substrate with anti-reflective properties defined here is ideally suited, for example, for application or integration in the display area, e.g. in the form of anti-reflective glazing for monitors, screens and displays.

A further field of application opens up in the area of achieving antireflection within optical fibers, which ensures higher transmission rates and minimizes back reflections. The process disclosed herein is therefore ideally suited for patterning glass fibers, so that the glass fiber patterned in this way provides a further example of application for a patterned substrate defined herein with anti-reflective properties. The present invention therefore also includes the use of a patterned substrate defined herein as a component of glass fibers.

In addition, the inventors have found that the method defined herein is suitable for patterning window panes (as another example of an anti-reflective glazing). For example, the patterned substrates disclosed herein can be used in the form of anti-reflective glazing or as a film coating on house facades, preferably extensive and/or transparent substrates, as heat-insulating glazing which can be used, for example, to protect against concentrated solar radiation from curved house facades and to improve the thermal insulation of buildings.

In addition, a reduction in reflection in microscopes and telescopes can increase the contrast of the images recorded with them, thereby increasing the efficiency and use of these optical devices. The present invention therefore also includes the use of a patterned substrate defined herein as an optical element having a periodic dot structure in the micro- or sub-micrometer range in optical devices, such as microscopes and telescopes, for which beam guidance, beam shaping, beam focusing and/or beam focusing are essential.

It is also useful to use the patterned substrate defined herein as a negative mold (so-called master), for example within an embossing process for the indirect application or generation of structures on another substrate. This is relevant, for example, in roll-to-roll processes in which structures are transferred from a master (usually metal such as nickel) to a polymer film (e.g. PET) in a continuous process using a hot or UV embossing process. This allows the inverse structures to be produced on other substrates in high throughput as periodic dot structures in the micro- or sub-micrometer range.

The apparatus according to the invention and the method according to the invention also offer the possibility of producing an extensive substrate with hydrophobic or super-hydrophobic properties without great technical effort. A substrate patterned in this way has a wide range of applications in areas in which the self-cleaning properties of hydrophobic and/or superhydrophobic substrates are desired, for example in the field of automotive components, displays or glazing, but also in the field of aviation or antenna technology.

The apparatus according to the invention and the method according to the invention also offer the possibility of producing an extensive substrate with hydrophilic or super-hydrophilic properties without great technical effort. A substrate patterned in this way has a wide range of applications in areas in which the homogeneous wetting properties of hydrophilic and/or superhydrophilic substrates are desired, for example in the field of automotive components, displays or glazing, but also in the field of aviation or antenna technology.

Furthermore, the method and apparatus according to the invention also provide the possibility of producing a patterned substrate which is suitable for further processing, for example chemical and/or physical treatment, in particular for coating by means of a chemical spray coating and/or in order to increase and/or modify the resulting anti-reflective properties and/or hydrophobic or superhydrophobic and/or hydrophilic or superhydrophilic properties of the substrate.

According to a preferred embodiment of the present invention, the method disclosed herein is suitable for patterning a substrate surface such that it has anti-glare properties. Particularly suitable for this purpose are patterned substrates with a dot structure which—as defined herein—are formed from a first and a second interference pixel, wherein the first and the second interference pixel each independently comprise a periodic dot structure with dimensions in the micro- and submicrometer range, wherein the first interference pixel and the second interference pixel are arranged superimposed to each other in such a way that the offset between the second interference pixel and the first interference pixel is in the range of $10\% \leq x \leq 50\%$, in particular in the range of $20\% \leq x < 50\%$, particularly preferably in the range of $25\% \leq x \leq 45\%$ of the interference period.

LIST OF REFERENCE SIGNS

1 laser radiation source
2 beam splitter element
3 optical path
4 focusing element
5 substrate
6 further deflecting element
7 deflecting element
8 polarization element
9 focusing mirror or galvo mirror
31 optical axis
91 polygon wheel

EXAMPLES OF EMBODIMENTS

The present invention is explained in more detail using the following figures and examples of embodiments, without limiting the invention to these. In particular, features shown in the individual figures and described for the respective example are not limited to the respective individual example.

Herein shows

FIG. 1: a schematic perspective view of an apparatus according to the invention.

Figure 2:
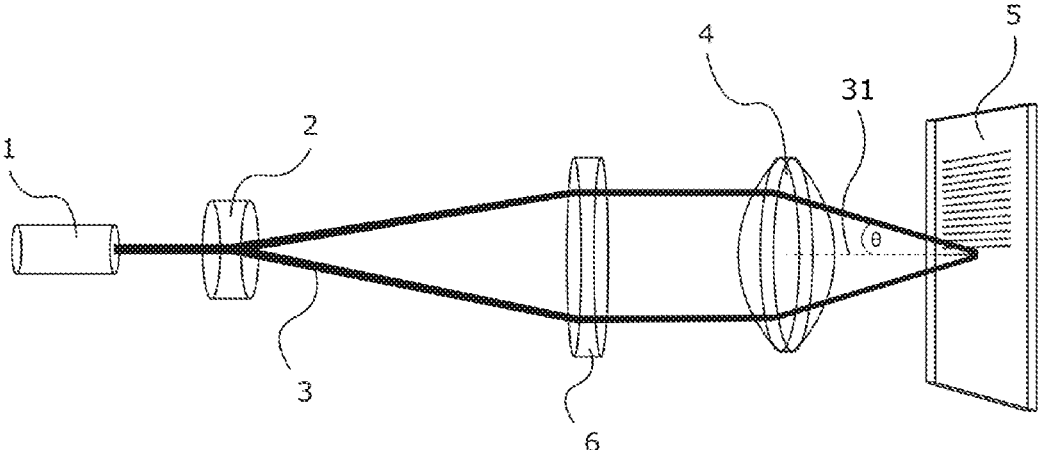

FIG. 2: a schematic perspective view of an apparatus according to the invention, which contains a deflecting element (6) for parallelizing the sub-beams.

Figure 3:
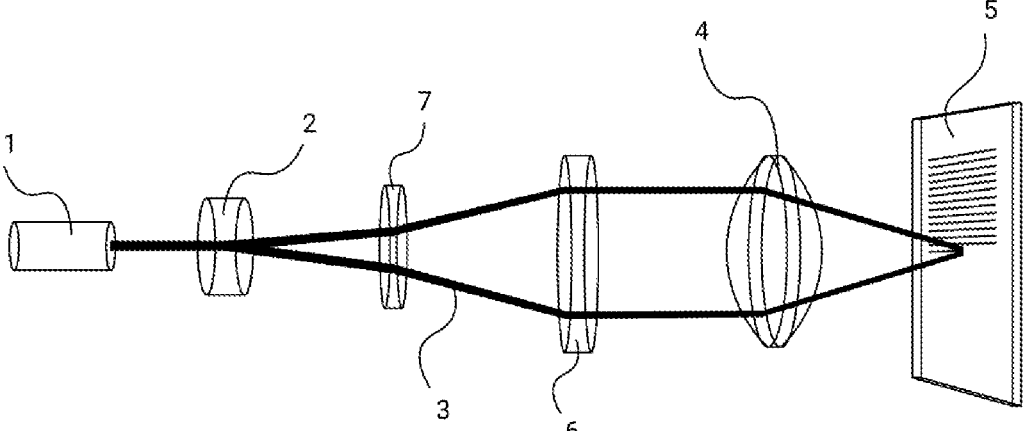

FIG. 3: a schematic perspective view of an apparatus according to the invention, which contains a deflecting element (7) for widening the angle of the sub-beams relative to the optical axis of the optical path (3)

Figure 4A:
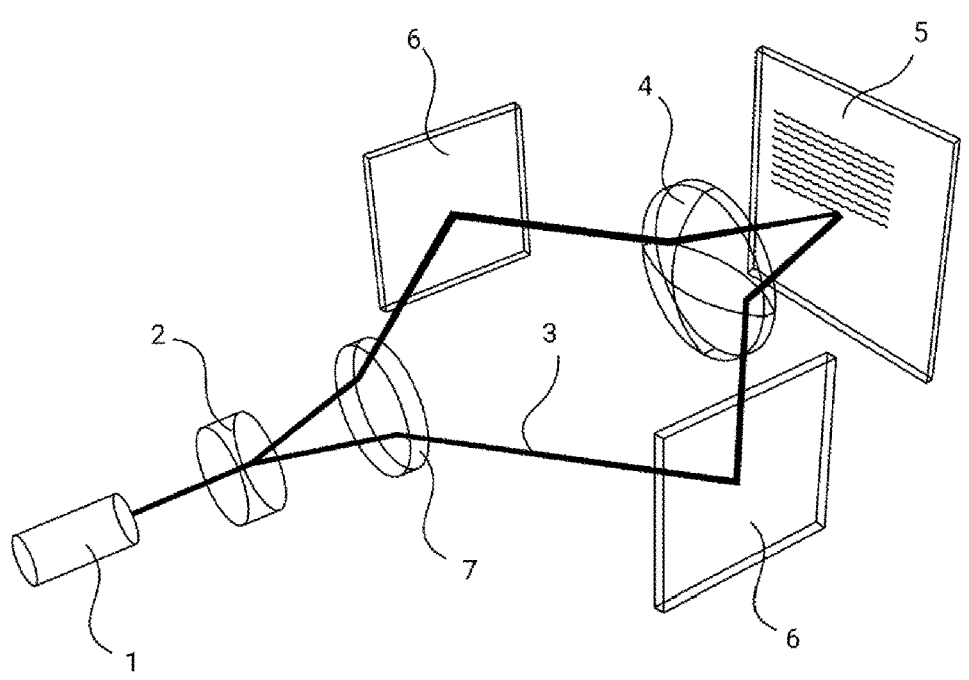

FIG. 4A: a schematic perspective view of an apparatus according to the invention comprising optical elements (6) with a planar, reflective surface which deflect the partial beams onto the focusing element (4).

Figure 4B:
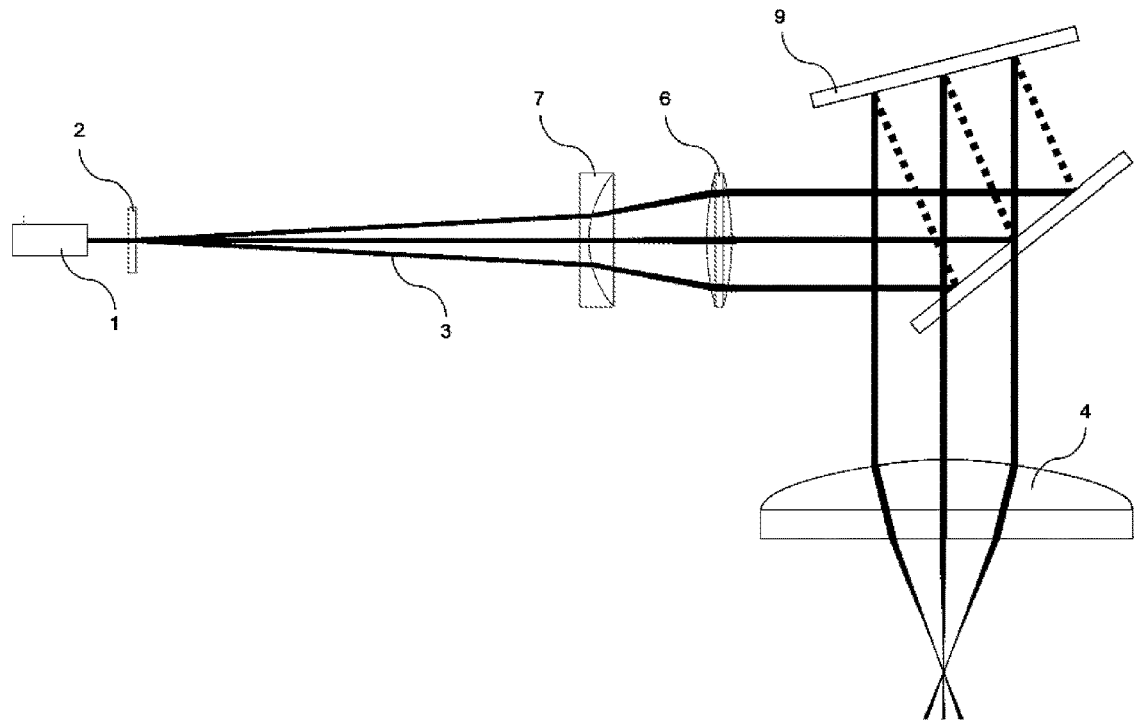

FIG. 4B: a schematic perspective view of an apparatus according to the invention, which comprises a galvo mirror (9) as an optical element for beam shaping, which permits stationary positioning of the substrate to be patterned during the patterning process.

Figure 5A:
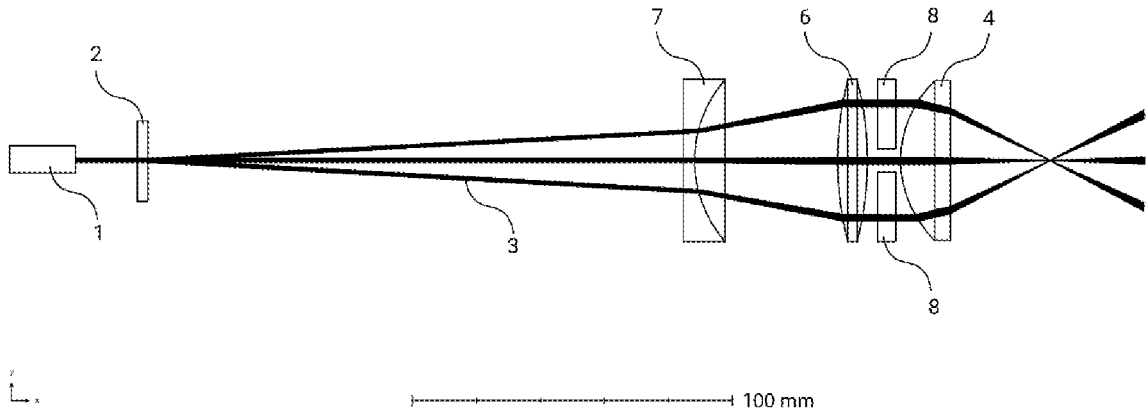
Figure 5B:
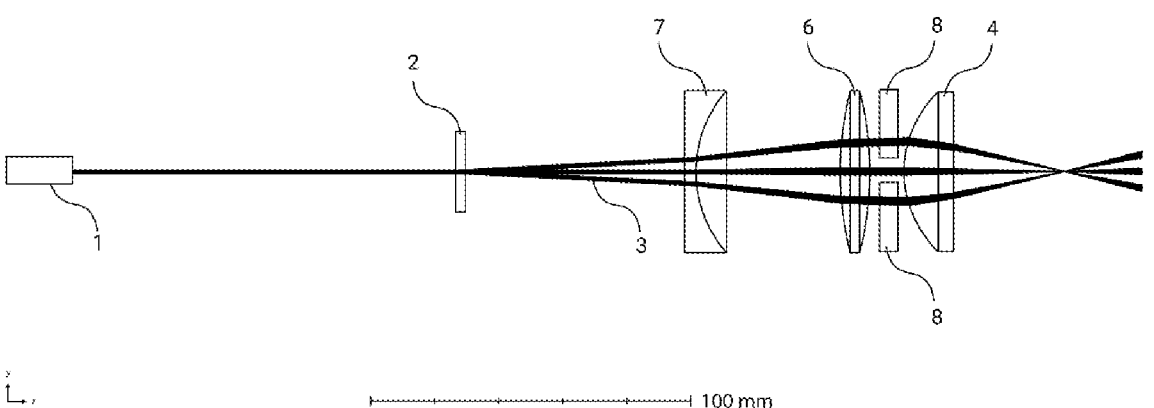

FIG. 5: a schematic perspective view of an apparatus according to the invention, wherein the apparatus contains a polarization element (8) which shifts the phase course of the sub-beams relative to one another, wherein a) the beam splitter element (2) is positioned in the optical path (3) close to the laser radiation source (1).

b) the beam splitter element (2) is positioned close to the deflecting element (7) in the optical path (3).

FIG. 6: a schematic view of the interference pixels resulting on the surface or inside the substrate with the width D, and the distribution of the individual interference pixels on the surface or inside the substrate, the interference pixels being shifted relative to one another with the pixel density Pd.

Figure 7:
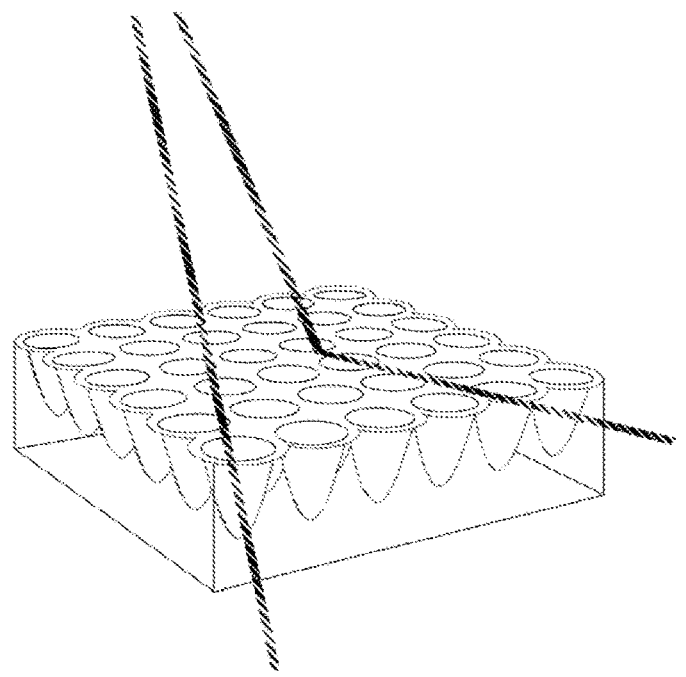

FIG. 7: a schematic perspective view of the patterned substrate (5) with the generated periodic dot structures, consisting of inverse cones, with dimensions in the micro- and submicrometer range, and symbolically the transmission of incident electromagnetic waves with wavelengths greater than the structure period of the generated structures, as well as the diffraction of incident electromagnetic waves with wavelengths in the range or smaller than the generated structures.

Figure 8:
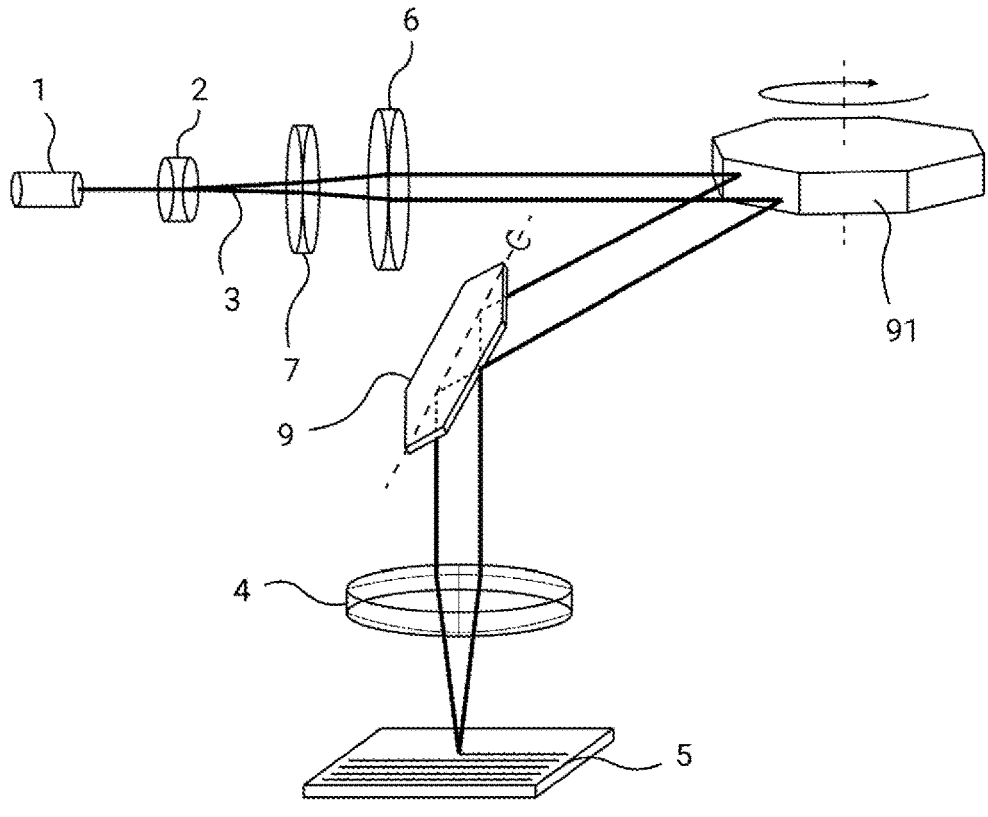

FIG. 8: a schematic perspective view of an apparatus according to the invention, which contains as an optical element a galvo mirror (9) with a planar, reflective surface, which deflects the sub-beams onto the focusing element (4), and a polygon wheel (91).

Figure 9:
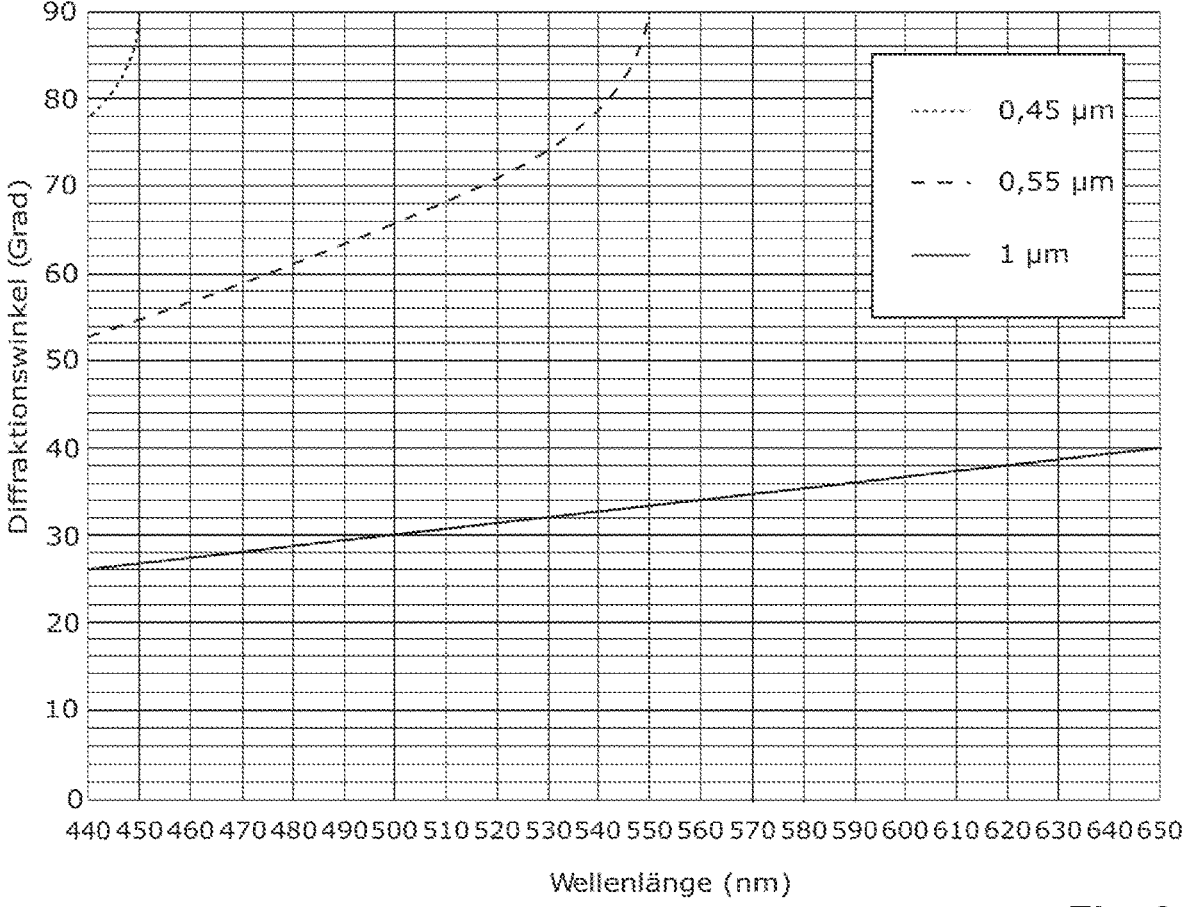

FIG. 9: A graphical representation of the angle of diffraction of incident light versus the wavelength of the incident light for patterned substrates with three different structure widths.

Figure 10:
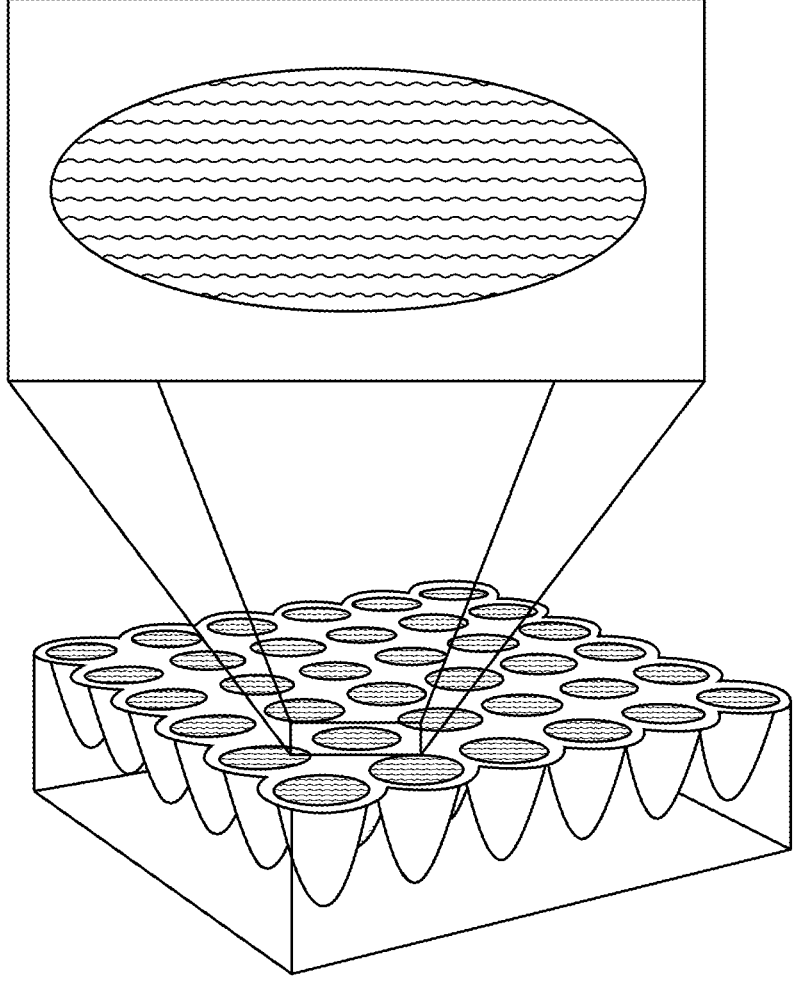

FIG. 10: a schematic perspective view of the patterned substrate (5) with the generated periodic dot structures, consisting of inverse cones, with dimensions in the micrometer range, on which a periodic wave structure in the submicrometer range is superimposed.

FIG. 1 visualizes in a first embodiment the apparatus according to the invention, comprising a laser radiation source (1) for emitting a laser beam. A beam splitter element (2), which is movably arranged in the optical path (3) of the laser beam behind the laser radiation source (1), is located in the beam path (3). A focusing element (4) is located in the optical path (3) of the laser beam behind the beam splitter element (2). A holding device, on which a substrate (5), preferably extensive and/or transparent substrate, is mounted, is arranged in the optical path (3) of the laser beam behind the focusing element (4).

In this embodiment, the laser radiation source (1) emits a pulsed laser beam. In this case, the laser radiation source is a UV laser with a wavelength of 355 nm and a pulse duration of 12 ps. In this embodiment, the radiation profile of the laser radiation source corresponds to a top-hat profile.

In this embodiment, the beam splitter element (2) corresponds to a diffractive beam splitter element. A diffractive beam splitter element here is a beam splitter element that contains micro- or nanostructures. The beam splitter element (2) divides the laser beam into 4 sub-beams.

In this embodiment, the focusing element (4) corresponds to a refractive, spherical lens that directs the sub-beams, which run essentially parallel to each other, onto the substrate (5), preferably extensive and/or transparent substrate, in such a way that they interfere there in an interference region. In this embodiment, the interference angle corresponds to 27.2°, resulting in a structure period of 550 nm for the periodic dot structure in the same polarization state.

According to this embodiment example, the extensive substrate is irradiated once, resulting in a processing time per structural unit, i.e. per interference pixel, of 12 ps.

The substrate (5), preferably extensive and/or transparent substrate, is a glass, in particular a quartz glass, which is mounted on a holding device so that it can be moved in the xy plane, perpendicular to the optical path of the laser beam emitted by the laser radiation source (1).

FIG. 2 visualizes in a further embodiment the apparatus as described in FIG. 1, additionally comprising a deflecting element (6), which is located in the optical path (3) of the laser after the beam splitter element (2) and the focusing element (4).

In this embodiment, the deflecting element is a conventional, refractive, convex lens. The sub-beams hit the deflecting element (6) in such a way that they are essentially parallel to each other after passing through the deflecting element. This allows the point at which the sub-beams interfere on the surface or inside the substrate to be adjusted.

FIG. 3 visualizes in a further embodiment an apparatus based on the setup shown in FIG. 1 and FIG. 2. In addition, this setup comprises a further deflecting element (6), which is arranged in the optical path (3) of the laser between the beam splitter element (2) and the deflecting element (7).

In this embodiment, the further deflecting element (7) is a conventional, refractive, concave lens. The sub-beams hit the further deflecting element in such a way that their angle to the optical axis of the optical path is widened. This allows the interference angle with which the sub-beams interfere on the surface or inside the substrate, preferably extensive and/or transparent substrate, to be changed.

In this embodiment, all optical elements apart from the beam splitter element (2) are fixed along the optical axis of the optical path (3). The interference angle of the sub-beams on the substrate is set by moving the beam splitter element (2) along the optical axis of the optical path.

FIG. 4A shows in a further embodiment an apparatus as in FIG. 3, comprising the optical elements (6) with a planar, reflective surface, which are configured so that they deflect the sub-beams onto the focusing element (4).

In this embodiment, the at least three sub-beams are deflected onto the substrate at a preferred angle by shifting the optical elements (6). This means that a deflecting element in the form of a lens (reference sign (6) in FIG. 3) can be dispensed with.

FIG. 5 visualizes in a further embodiment an apparatus as in FIG. 3, additionally comprising one polarization element (8) per sub-beam, which are arranged in the optical path (3) of the laser beam between the deflecting element (6) and the focusing element (4).

The polarization element is arranged in such a way that it changes the polarization of the individual sub-beams in relation to each other in such a way that a change in the interference pattern results.

This embodiment is shown in two different configurations. In FIG. 5 *a*), the beam splitter element (2) is positioned close to the laser radiation source (1) in the optical path (3). In FIG. 5 *b*), the beam-splitter element (2) is positioned close to the deflecting element (7) in the optical path (3). In this way, the interference pattern of the interfering sub-beams on the surface of the substrate (5) can be infinitely adjusted without having to move the other optical elements in the setup or the substrate.

It would also be conceivable for the arrangement to contain an additional optical element for beam shaping, which is arranged in succession of the laser radiation source (1) in the optical path (3) of the laser beam. In this embodiment, the radiation profile of the laser radiation source corresponds to a Gaussian profile. The optical element for beam shaping converts this profile into a top-hat profile.

FIG. 6 contains a schematic view of the interference pixels resulting on the surface or inside the substrate with the width D, and the distribution of the individual interference pixels on the surface or inside the substrate, whereby the interference pixels are shifted relative to one another with the pixel density Pd.

In this embodiment, the pixel density Pd is smaller than the width of an interference pixel, D. Thus, by moving the substrate (5) by means of a pulsed laser beam, an extensive homogeneous periodic dot structure can be generated on the surface or in the interior of a substrate, preferably extensive and/or transparent substrate.

FIG. 7 visualizes the patterned substrate (5) produced by the method according to the invention with the generated periodic dot structures, consisting of inverse cones, with dimensions in the micro- and submicrometer range. The transmission of incident electromagnetic waves with wavelengths greater than the structure period of the generated structures and the diffraction of incident electromagnetic waves with wavelengths in the range of or smaller than the generated structures are also symbolically illustrated.

FIG. 8 shows in a further embodiment an apparatus as in FIG. 4B, comprising the optical element (91) with a planar, reflective surface, which is a polygon wheel that is configured so that it rotates about a marked axis. The incident sub-beams are deflected in such a way that they hit a galvo mirror (9), which directs the beams onto the substrate via a focusing element (4). The rotation of the polygon wheel causes the point at which the beams are focused on the substrate to move along a line during the exposure process. The sub-beams therefore scan the substrate, which leads to an increased process speed.

FIG. 9 shows a graphical representation of the transmission and diffraction capability of a patterned substrate as a function of the structure width. The diffraction angle of light is shown as a function of its wavelength for structures with three different structure widths. If the wavelength of the incident light is greater than the structure width, the light is completely transmitted. At wavelengths in the range of the structure width or smaller, diffraction occurs. The diffraction angles can be taken from the diagram.

FIG. 10 visualizes the patterned substrate (5) produced by the method according to the invention with the generated periodic dot structures, consisting of inverse cones, with dimensions in the micrometer range. Superimposed on this periodic dot structure in the micrometer range is a periodic wave structure in the submicrometer range, which can also be produced in one production step by the method according to the invention described herein.

The invention claimed is:

1. A patterned substrate with anti-reflective properties, comprising a periodic dot structure in a micro- or sub-micrometer range;
   wherein the periodic dot structure is formed of inverse cones;
   wherein the inverse cones are arranged periodically with a distance from one another in a range of 50 nm to 50 μm;
   wherein a quasi-periodic wave structure is superimposed on the periodic dot structure;

wherein the quasi-periodic wave structure has a sequence of wave crests and wave troughs with a periodicity in a range of 100 nm to 1000 nm; and
   wherein the quasi-periodic wave structure is generated by utilizing laser-induced periodic surface structures (LIPSS).

2. The patterned substrate according to claim 1, wherein the periodic dot structure is formed such that the patterned substrate transmits electromagnetic radiation with a wavelength of more than 550 nm.

3. The patterned substrate according to claim 1, wherein the wave crests are arranged with a spacing in a range from 20 nm to 5 μm.

4. The patterned substrate according to claim 1, wherein the patterned substrate comprises a dot structure formed of a first interference pixel and a second interference pixel, the first interference pixel and the second interference pixel each independently comprise the periodic dot structure having dimensions in the micro- and/or sub-micrometer range, and the first interference pixel and the second interference pixel are arranged superimposed on each other such that an offset between the second interference pixel and the first interference pixel is in a range of $10\% \le x \le 50\%$ of an interference period.

5. The patterned substrate according to claim 1, wherein the patterned substrate comprises a transparent material, and wherein the transparent material is selected from the group consisting of glass, solid polymers, and transparent ceramics.

6. The patterned substrate according to claim 1, wherein a refractive index of the patterned substrate is gradual.

7. A laser interference patterning apparatus for direct laser interference patterning of a substrate for producing the patterned substrate according to claim 1, comprising:
   a laser radiation source (1) for emitting a laser beam,
   a beam splitter element (2) arranged in an optical path (3) of the laser beam,
   a focusing element (4) which is arranged in succession of the beam splitter element (2) in the optical path of the laser beam and configured so that sub-beams pass through it in such a way that the sub-beams are interfereable on a surface or in a volume of a substrate (5) in an interference region,
   characterized in that,
   the beam splitter (2) is freely movable along its optical axis in the optical path (3),
   the beam splitter (2) is set up to split the laser beam emitted by the laser radiation source (1) into at least three sub-beams,
   wherein a first deflecting element (7) is arranged in succession of the beam splitter element (2) in the optical path (3) of the laser radiation source (1), which is configured so that the at least three sub-beams are widened when passing through the first deflecting element (7).

8. The apparatus according to claim 7, wherein a further deflecting element (6) is arranged in succession to the laser radiation source (1) and the beam splitter element (2) in the optical path (3), which is configured so that it deflects the sub-beams in such a way that they run essentially parallel to one another after emerging from the further deflecting element (6).

9. The apparatus according to claim 7, wherein the deflecting element (7) is a concave lens.

10. The apparatus according to claim 8, wherein the further deflecting element (6) is a convex lens.

11. The apparatus according to claim 7, wherein the laser radiation source (1) is a pulsed laser radiation source with pulse widths in a range from 10 nanoseconds to 10 femtoseconds.

12. A method for producing a substrate with a periodic dot structure in a micro- or sub-micrometer range by means of laser interference patterning, in particular for producing the patterned substrate according to claim 1, comprising the following steps:

a) providing a substrate (5), b) emitting a laser beam from a laser radiation source (1), c) splitting the laser beam by means of a beam splitter element (2) into at least three sub-beams, d) focusing the sub-beams onto a surface or within a volume of the substrate (5), so that the sub-beams interfere constructively and destructively on the surface or within the volume of the substrate (5), characterized in that the at least three sub-beams are superimposed on the substrate (5) by the focusing such that the periodic dot structure in the micro- or sub-micrometer range is generated on the surface or in the volume of the substrate (5), wherein the periodic dot structure is formed of the inverse cones, wherein the inverse cones are arranged periodically at the distance from one another in the range from 50 nm to 50 μm, wherein the quasi-periodic wave structure is superimposed on the periodic dot structure, wherein the quasi-periodic wave structure has the sequence of wave crests and wave troughs with the periodicity in the range of 100 nm to 1000 nm.

13. The method according to claim 12, wherein a structure period of the generated periodic dot structure of the substrate (5) is steplessly adjustable in the micro- or sub-micrometer range by moving the beam splitter element (2) along its optical axis in an optical path (3) of laser beam.

14. The method according to claim 12, wherein the substrate (5) comprises a transparent material and the sub-beams interfere inside the transparent material.

15. The method according to claim 12, comprising the following steps:

applying a first pulse on the surface of the substrate (5), which generates a first interference pixel on the surface of the substrate (5) or within the volume of the substrate (5), applying a second pulse to the surface of the substrate (5), which generates a second interference pixel on the surface of the substrate (5) or within the volume of the substrate (5), wherein the first and second interference pixels each independently comprise the periodic dot structure with dimensions in the micro- and sub-micrometer range, characterized in that an offset between the second interference pixel and the first interference pixel is in a range of 10%≤x≤50% of an interference period.

16. The method according to claim 15, wherein after step b), a third pulse is applied on the surface of the substrate (5), wherein the third pulse generates a third interference pixel on the surface of the substrate (5) or within the volume of the substrate (5), wherein the third interference pixel has an offset in the range of 10%≤x≤50% of the interference period with respect to the second interference pixel, and wherein the third interference pixel comprises a periodic dot structure with dimensions in the micro- and sub-micrometer range.

17. The method according to claim 15, wherein the offset of the interference period is uniform in at least one spatial direction.

18. A process comprising:

utilizing the patterned substrate according to claim 1 in photovoltaic systems.

19. A process comprising:

utilizing the patterned substrate according to claim 1 as anti-reflective glazing of monitors, screens and displays.

20. A process comprising:

utilizing the patterned substrate according to claim 1 in glass fibers.

21. A process comprising:

utilizing the patterned substrate according to claim 1 as a negative mold for indirectly applying or creating patterns on another substrate.

\* \* \* \* \*